(12) United States Patent  
Strano et al.

(10) Patent No.: US 8,941,285 B2  
(45) Date of Patent: Jan. 27, 2015

(54) NANOSCALE THERMOELECTRIC WAVE GENERATORS

(75) Inventors: Michael S. Strano, Lexington, MA (US); Won Joon Choi, Cambridge, MA (US); Joel T. Abrahamson, Cambridge, MA (US); Jae-Hee Han, Seongnam (KR)

(73) Assignee: Massachusetts Institute of Technology, Cambridge, MA (US)

( * ) Notice: Subject to any disclaimer, the term of this patent is extended or adjusted under 35 U.S.C. 154(b) by 340 days.

(21) Appl. No.: 13/453,780

(22) Filed: Apr. 23, 2012

(65) Prior Publication Data

US 2012/0262027 A1  Oct. 18, 2012

Related U.S. Application Data

(63) Continuation-in-part of application No. PCT/US2010/053798, filed on Oct. 22, 2010.

(60) Provisional application No. 61/253,905, filed on Oct. 22, 2009.

(51) Int. Cl.
*H02N 11/00* (2006.01)
*H01L 35/00* (2006.01)
*B82Y 10/00* (2011.01)

(52) U.S. Cl.
CPC ............... *H01L 35/00* (2013.01); *B82Y 10/00* (2013.01)
USPC ........ 310/300; 423/444; 423/442; 423/447.1; 427/533; 427/537; 427/538

(58) Field of Classification Search
CPC ............................. B82Y 10/00; H01L 35/00
USPC ........ 310/300; 423/444, 442, 447.1; 427/533, 427/537, 538
See application file for complete search history.

(56) References Cited

U.S. PATENT DOCUMENTS 7,276,266 B1 * 10/2007 Khare et al. ............... 427/533
2003/0034295 A1 * 2/2003 Strano et al. ............... 210/483

(Continued)

FOREIGN PATENT DOCUMENTS

JP        2004335599 A    11/2004
KR    10-2007-0037582      4/2007
WO    WO 2005012172 A2 *  2/2005  ............. C01B 31/02

OTHER PUBLICATIONS

International Search Report and Written Opinion for Application No. PCT/US2010/053798 mailed Jul. 26, 2011. (10 pages).

(Continued)

*Primary Examiner* — Alex W Mok
(74) *Attorney, Agent, or Firm* — Nutter McClennen & Fish LLP

(57) ABSTRACT

In one aspect, the present invention provides nanosized systems for generating electrical energy based on the use of a chemically reactive composition to generate a thermoelectric wave. For example, the system can include at least one nanostructure (e.g., a carbon nanotube) extending along an axial direction between a proximal end and a distal end. A chemically reactive composition is dispersed along at least a portion of the nanostructure, e.g., along its axial direction, so as to provide thermal coupling with the nanostructure. The chemical composition can undergo an exothermic chemical reaction to generate heat. The system can further include an ignition mechanism adapted to activate the chemical composition so as to generate a thermal wave that propagates along the axial direction of the nanostructure, where the thermal wave is accompanied by an electrical energy wave propagating along the axial direction.

23 Claims, 23 Drawing Sheets

(56) References Cited

U.S. PATENT DOCUMENTS

| | | | |
|---|---|---|---|
| 2004/0038251 A1* | 2/2004 | Smalley et al. | 435/6 |
| 2004/0040834 A1* | 3/2004 | Smalley et al. | 204/164 |
| 2006/0231399 A1* | 10/2006 | Smalley et al. | 204/450 |
| 2007/0258880 A1* | 11/2007 | Murakoshi | 423/447.1 |
| 2007/0292896 A1* | 12/2007 | Strano et al. | 435/7.9 |
| 2008/0057192 A1 | 3/2008 | Faguet | |
| 2008/0063587 A1* | 3/2008 | Strano et al. | 423/447.1 |
| 2009/0085454 A1 | 4/2009 | Li et al. | |

OTHER PUBLICATIONS

International Preliminary Report on Patentability for Application No. PCT/US2010/053798 mailed May 3, 2012. (7 pages).

* cited by examiner

TNA LAYER AROUND CARBON NANOTUBE (CNT)

CNT    TNA

NANOSCALE THERMOELECTRIC WAVE GENERATORS

RELATED APPLICATIONS

This application is a continuation-in-part of co-pending International Application No. PCT/US10/53798, entitled "Nanoscale Thermoelectric Wave Generators" and filed Oct. 22, 2010, which International Application designates the United States and which claims priority to U.S. Provisional Application No. 61/253,905, entitled "Nanoscale Thermoelectric Wave Generators" and filed on Oct. 22, 2009. These applications are hereby incorporated by reference in their entireties.

BACKGROUND

The present invention relates generally to systems and methods for generating electrical and/or pressure pulses, and more particularly, to such systems and methods that generate electrical and pressure pulses by utilizing thermal waves propagating along nanostructures, such as carbon nanotubes.

Portable energy storage and delivery is a key requirement of modern transportation systems and facilitates the proliferation of portable electronic devices. This rapidly growing field already represents a multi-billion dollar per year market across the globe. The miniaturization of electronic devices, network nodes for communications, and remote sensors is driven in part by the favorable scaling of energy requirements for many applications. That is, the reduced energy demand can offset the reduced energy storage capacity. Some critical applications, however, do not scale favorably with reductions in size. For example, radio frequency (RF) communication over a practical distance imposes a fixed power demand. In addition, development of the next generation of autonomous and mobile sensors, robots, and off-grid wireless networks, particularly devices at the micro- and nano-scale, is often hampered by the lack of high power density energy systems of similar size.

Conventional approaches for solving these problems have significant disadvantages. For example, harvesting ambient thermal, solar, or acoustic/mechanical energy is appealing because of the small sizes of such devices and their ability to work with otherwise wasted energy. However, the power generated tends to be too small for applications such as long-distance communication (where the coverage radius scales with the square root of power) or acceleration. Harvesters can collect energy slowly over time and subsequently discharge it rapidly, but this requires additional energy storage systems that impose limits on the systems and/or devices.

Batteries are one of the most familiar forms of energy storage for electricity, but electrochemical energy density is fundamentally limited compared to storing energy in the chemical bonds of fuels. For example, ethanol has a specific energy storage of 26.8 MJ/kg, whereas lithium-ion batteries can only store 0.720 MJ/kg, about 2.7% of the capacity of ethanol. Further, ethanol's energy density is about 20 times larger in volume terms (i.e., energy per unit volume). Batteries also rely on internal mass transport to develop charge and therefore require large electrode surface areas. This means that even small batteries are formed as thin films, which are not ideal for compact devices. Still further, batteries slowly lose their charge over years, making them less ideal for long-term energy storage. For example, batteries with a two-year half-life will lose 31% of their charge in one year. Supercapacitors can exhibit substantially higher power densities (in weight and volume terms), but at the expense of energy density. Moreover, supercapacitors cannot hold their charge as long as batteries.

Fuel cells and engines utilize the large energy density of chemical fuels, but are more complicated to fabricate at small scale. However, their power density has been limited so far. Accordingly, there is a need for improved systems, devices and methods for generating electrical energy, and particularly for generating electrical pulses having high peak powers for use in miniaturized devices.

SUMMARY

The present invention generally provides systems, devices and methods that utilize thermopower waves to overcome the problems of traditional batteries and fuel cells. These systems allow for the rapid release of energy from stable storage in chemical fuels. In various embodiments of the systems and devices described herein, high-conductivity scaffolds, such as carbon nanotubes (CNTs), direct a hot chemical reaction wave along their length. Without being limited to any particular theory, the thermal wave also pushes charge carriers to create a high-power pulse of electricity. Thermopower wave devices can provide superior performance over conventional thermoelectric materials (e.g., $Bi_2Te_3$, $Sb_2Te_3$) that utilize static thermal gradients, both in terms of power density and efficiency (e.g., devices described herein can have a power density up to 20 W/2, about ten times larger than lithium-ion batteries). Further, the materials and architectures described herein can be scaled to sizes less than about 1 $mm^3$ (millimeter cubed), making them suitable for use with microelectromechanical systems (MEMS) and other micro and nano-scale devices, among others.

in one aspect, the present invention provides nanosized systems for generating electrical energy based on the use of a chemically reactive composition to generate thermoelectric wave. For example, the system can include at least one nanostructure extending along an axial direction between a proximal end and a distal end. The nanostructure can exhibit a thermal conductivity equal to or greater than about 500 W/m/K and an electrical conductivity equal to or greater than about $10^5$ siemens/meter (S/m) along the axial direction. A chemically reactive composition is dispersed along at least a portion of the nanostructure, e.g., along its axial direction, so as to provide thermal coupling with the nanostructure (that is, there is a thermal path, e.g., via contact or otherwise, between the chemical composition and the nanostructure). The chemical composition can undergo an exothermic chemical reaction to generate heat. The system can further include an ignition mechanism adapted to activate the chemical composition so as to generate a thermal wave that propagates along the axial direction of the nanostructure, where the thermal wave is accompanied by an electrical energy wave propagating along the axial direction.

A variety of chemically reactive compositions (compounds) can be utilized in the above system. In some cases, the chemical composition undergoes a decomposition reaction in response to activation so as to generate heat. In some embodiments, the chemical composition can be a solid fuel, a liquid fuel, or a combination thereof. By way of example, the chemical composition can be cyclotrimethylene-trinitramine (TNA), picric acid, picramide, nitrocellulose, trinitrotoluene, JP-8 jet fuel, gasoline, ethanol, isopropanol, or formic acid.

In some implementations, the ignition mechanism is adapted to activate the reactive composition in proximity of a proximal end of the nanostructure(s) to undergo a chemical reaction to generate a thermal wave. As the thermal wave propagates axially along the nanostructure it causes the activation of the other portions of the chemical composition, which in turn generates thermal energy that sustains the thermal wave, and a concomitant electrical energy wave, propagating along the nanostructure towards its distal end.

In some cases, the generated electrical energy wave (pulse) can exhibit a peak power as large as about 20 W/g or greater.

The ignition mechanism can be implemented in a variety of different ways. For example, the ignition mechanism can include a laser source, e.g., a laser diode that can generate 400 mW at a wavelength of 785 nm. Alternatively, the ignition mechanism can generate a high voltage electrical discharge spark, e.g., 3 kV DC and 5 milliamps, for activating the chemical composition. As another alternative, the ignition mechanism can locally heat the source, e.g., with a wire used as an electrical resistance heater operating at about 1-3 V DC and about 1.5 amps (the voltage and current depend on the resistance of the wire). As another alternative, the ignition mechanism can also include a small flame source, such as a torch or burner.

In one embodiment, the system can include an elongated nanostructure such as a carbon nanotube. In some cases, multi-walled or single-walled carbon nanotube(s) can be employed as the elongated nanostructure. These carbon nanotubes can be employed, for example, in the form of a bundle, aligned array, mat, fiber, or yarn. In other implementations, the elongated nanostructure can be a nanowire formed, for example, of silicon, boron nitride, nickel silicide, or lead sulfide.

In another embodiment, the system can include a sheet of a material, such as graphene, characterized by two opposed surfaces separated by a thickness of the material forming the sheet (e.g., a thickness less than about 25 nm), where the sheet extends along a longitudinal direction from a proximal end to a distal end. In some implementations, the sheet can exhibit a thermal conductivity equal to or greater than about 2000 W/m/K and an electrical conductivity equal or greater than about $10^7$ S/m at least along the longitudinal direction.

A chemically reactive composition is disposed on at least a portion of at least one of said surfaces (e.g., it coats the surface) so as to be in thermal coupling with at least that surface. The reactive composition is capable of undergoing a chemical reaction in response to activation to generate heat. The system can further include an ignition mechanism adapted to activate the chemical composition so as to generate a thermal wave propagating longitudinally along the sheet, where the thermal wave is accompanied by a co-propagating wave of electrical energy.

In certain embodiments, the system can include a catalyst to lower the activation energy required from the ignition mechanism to ignite the chemically reactive composition. For example, in some embodiments, the system can include a nanostructure having metal nanoparticles disposed thereon in combination with a liquid chemically reactive composition. The nanoparticles can aid the reaction of the liquid fuel to create thermopower waves.

In another aspect, the present invention provides a method of generating electrical energy, which comprises providing a nanostructure (e.g., a carbon nanotube or a sheet having a nanosized thickness) extending along an axial direction with a chemically reactive compound disposed (e.g., dispersed) on at least a portion thereof (e.g., in the form of a coating), where the compound is in thermal contact with the nanostructure. The nanostructure can exhibit a thermal conductivity equal to or greater than about 500 W/m/K and an electrical conductivity equal to or greater than about $10^5$ S/m along the axial direction. A chemical reaction can be initiated in a portion of the chemically reactive compound at a location along the axial direction so as to generate a thermal wave propagating along the nanostructure to cause a chemical reaction in other portions of the reactive compound, thereby generating and sustaining a thermal wave propagating along the axial direction. The thermal wave is accompanied by an electrical pulse propagating along the axial direction.

Further understanding of the invention can be obtained by reference to the following detailed description and the associated drawings, which are discussed briefly below.

DETAILED DESCRIPTION

In some aspects, the present invention provides systems and methods for converting chemical energy into electrical and/or mechanical energy propagating along nanoscale conduits, such as nanotubes or nanowires. By way of example, in some cases, a nanostructure can be coated, at least partially, with a chemically reactive compound that can be activated at a location along the nanostructure to undergo a chemical reaction, e.g., an exothermic reaction, that generates thermal energy. The nanostructure can provide a conduit for anisotropic propagation of this thermal energy that can in turn initiate an exothermic reaction in other portions of the coating so as to sustain a thermal wave moving along the nanostructure conduit. The thermal wave is accompanied by a pulse of electrical energy that propagates along the conduit as well. The term "nanostructure," as used herein, refers to a material structure having a size less than about 1 micrometer, in at least one dimension (e.g., in one of x, y, or z dimensions). Similarly, the term "nanosized" is used herein to indicate a size in at least one dimension that is about 1 micrometer, and in some cases less than about 500 nanometers (am), or less than about 200 nm or less than about 100 nm. In many embodiments, the nanostructure can have an aspect ratio (ratio of length to cross-sectional diameter) that is greater than about 1,000,000. In the embodiments discussed below, various salient features of invention are discussed in connection with carbon nanotubes. It should, however, be understood that the teachings of the invention can also be practiced by employing other types of nanostructures, such as nanowires. The term "carbon nanotube(s)" is known in the art and generally refers to allotropes of carbon exhibiting a nanostructure with a length-to-diameter ratio greater than about 1,000 e.g., in some cases up to about 28,000,000.

Figure 1:
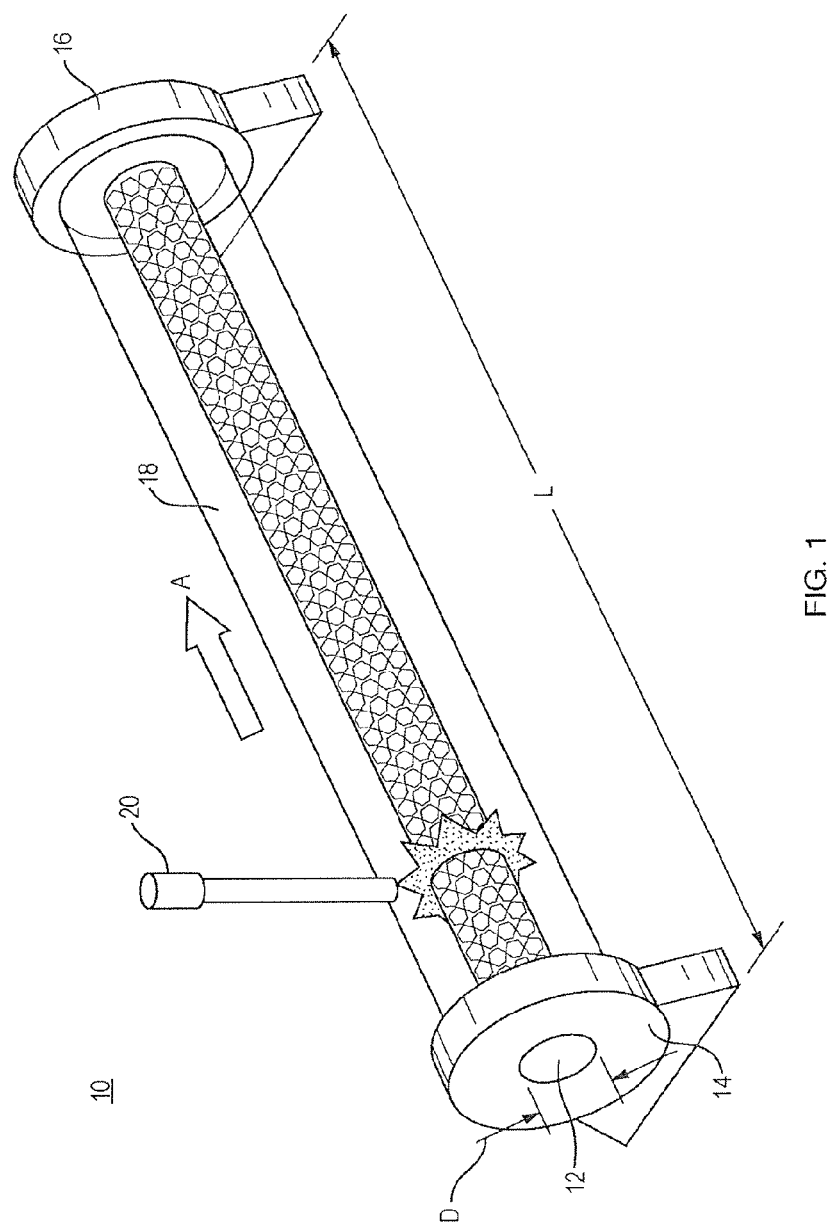
FIG. 1 schematically depicts a system according to an embodiment of the invention for converting chemical energy into electrical energy, FIGS. 2A-2C schematically depict an exemplary implementation of the system of FIG. 1, which includes at least one multi-walled carbon nanotube (MINT) coated with TNA, FIG. 3 schematically depicts a mechanism for initiating a chemical reaction in the coating of the carbon nanotube depicted in the previous figures via a high voltage electrical discharge.

FIG. 1 schematically depicts a system 10 according to an embodiment of the invention for generating an electrical pulse, which includes a multi-walled carbon nanotube 12 (MWNT) that extends along an axial direction (A) between a proximal end 14 and a distal end 16. In this implementation, the number of walls of the multi-walled carbon nanotube ranges from two to about 10, though in other implementations multi-walled carbon nanotubes with a different number of walls can be employed. The exemplary carbon nanotube 12 exhibits a thermal conductivity equal or greater than about 500 W/m/K and an electrical conductivity equal or greater than about $10^5$ S/m along the axial direction (A). By way of example, the carbon nanotube can exhibit such a high thermal conductivity at a temperature equal or greater than about 2000 K. In this exemplary implementation, the ratio of the diameter (D) of the carbon nanotube 12 to its length (L), which is herein referred to as the aspect ratio of the nanotube, is less than about 70,000,000, e.g., in a range of about 100,000 to about 50,000,000.

A shell 18 formed of a chemically reactive compound peripherally surrounds the carbon nanotube 10 along the axial direction to form an annular coating around the nanotube. By way of example, the shell can have a thickness in a range of about 4 to about 20 nanometers. While in this implementation the shell extends axially from the proximal end 14 to the distal end 16 to coat the entire axial extent of the carbon nanotube, in other implementations it can extend axially along only a portion of the carbon nanotube. The chemically reactive compound forming the shell is in thermal coupling with the carbon nanotube 12, e.g., via contact with an outer surface of the carbon nanotube in this implementation. The chemically reactive compound can be activated to undergo an exothermic chemical reaction, e.g., a decomposition reaction, to generate heat. By way of example, the chemically reactive compound can exhibit a thermal conductivity less than about 5 W/m/K.

Figure 2A:
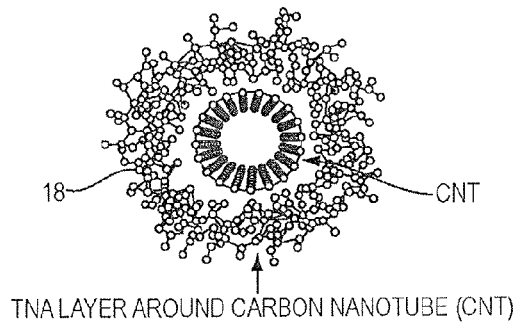
Figure 2B:
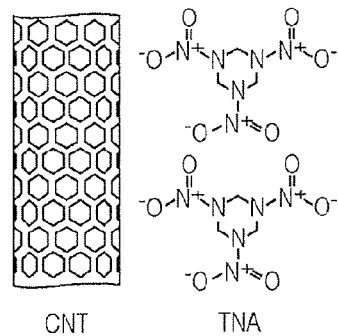
Figure 2C:
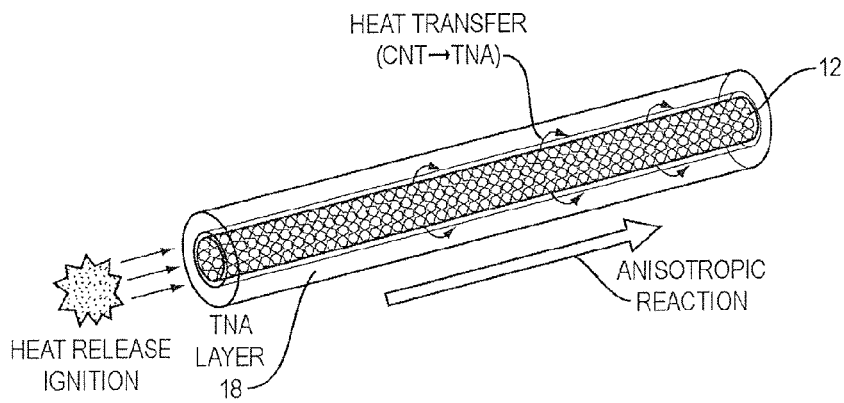

With reference to FIGS. 2A-2C, in this implementation, the shell 18 is formed of cyclotrimethylene-trinitramine (TNA) and has a thickness in a range of about 6 nm to about 9 nm (e.g., about 7 nm). The TNA can be activated (ignited) to undergo is decomposition reaction that generates heat together with rapidly expanding gaseous decomposition products.

More specifically, referring again to FIG. 1, the exemplary system 10 includes an ignition mechanism 20 that can activate the reactive compound (e.g., TNA in this implementation) at a selected location along the nanotube, e.g., close to the proximal end in this implementation, to cause its decomposition. In this implementation, the ignition mechanism includes a laser light source that generates radiation capable of igniting the TNA. By way of example, the ignition mechanism can include a laser diode that can generate 400 mW of radiation at a wavelength of 785 nm. In some implementations, a single pulse of such a laser directed, e.g., via focusing, to a location along the TNA coating can ignite the INA at that location. As discussed in detail below, such initial ignition can result in an axially propagating chain reaction along the TNA annular coating to ignite the other portions of the TNA.

Figure 3:
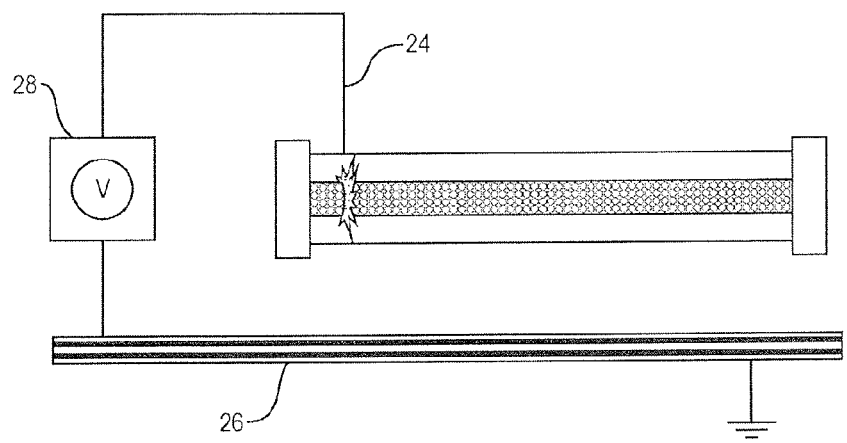

Alternatively, the ignition mechanism can include a mechanism for generating a high voltage electrical discharge. For example, FIG. 3 schematically depicts such a mechanism 22 that includes a wire 24 formed, e.g., of tungsten, that is suspended over a conductive plate 26, e.g., formed of tungsten, with a gap between the wire's tip and the tungsten plate. A high voltage power supply 28 can apply a high voltage, e.g., up to about 3 kV, across the wire tip and the plate to initiate a discharge within the gap. As shown schematically in FIG. 3, the coated nanotube (in this case TNA coated multi-walled carbon nanotube) can be attached to the wire's tip at a selected location to be suspended over the plate 26. The power supply can apply a high voltage to the wire to cause an electrical discharge between the coated nanotube and the tungsten plate. The electrical discharge can in turn initiate the chemical reaction in the reactive coating, e.g., a decomposition reaction in the TNA coating.

Figure 4:
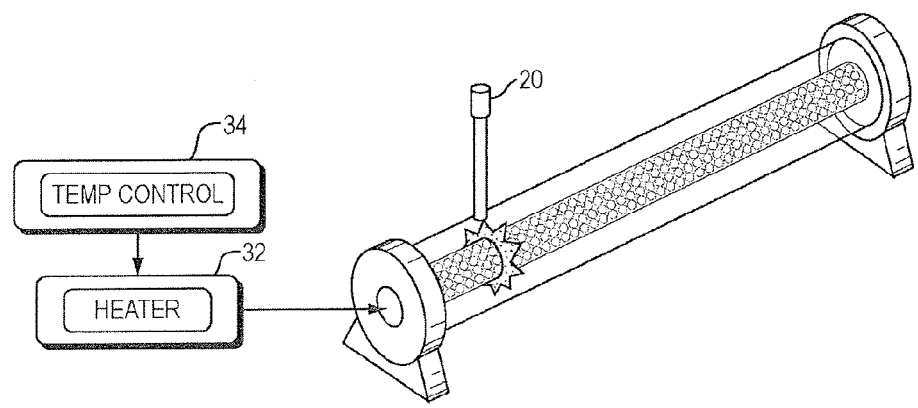
FIG. 4 shows another exemplary implementation of the system of FIG. 1 in which a heater and a temperature controller are employed to preheat the coated nanotube prior to initiating an exothermic chemical reaction in the nanotube's reactive coating, FIG. 5 schematically depicts an exemplary set-up for detecting thermopower waves generated in a system according to the invention.

With reference to FIG. 4, in some implementations, a heater 32 operating under the control of a temperature controller 34 can be utilized to preheat the coated nanotube, e.g., up to a temperature of about 423 K, prior to initiating an exothermic chemical reaction in the reactive coating. Alternatively, the chemical reaction can be initiated without preheating the carbon nanotube, e.g., it can be initiated at a temperature of about 300 K.

Referring again to FIG. 1, in use, the initiation of a chemical reaction in the coating, e.g., in the vicinity of the proximal end 14 in this exemplary implementation, can generate heat that will propagate as a thermal wave axially along the carbon nanotube. The heat wave in turn causes the initiation of the chemical reaction in other portions of the chemical coating (a chain reaction), to sustain a reaction wave and an associated heat wave. As each portion of the chemical coating undergoes the chemical reaction it generates heat, which sustains the heat wave as it propagates from the proximal end to the distal end. In some cases, such a sustained reaction wave can move axially along the nanotube at a velocity that can be more than two orders of magnitude greater than the bulk combustion rate of the reactive material forming the coating. For example, a steadily propagating wave with a velocity of 1.2+/−0.4 m/sec was observed in a prototype multi-walled carbon nanotube that was coated with a TNA with a thickness of about 7 nm. The speed of a reaction wave in bulk TNA alone is between 0.2 and 0.5 mm/sec.

Figure 5:
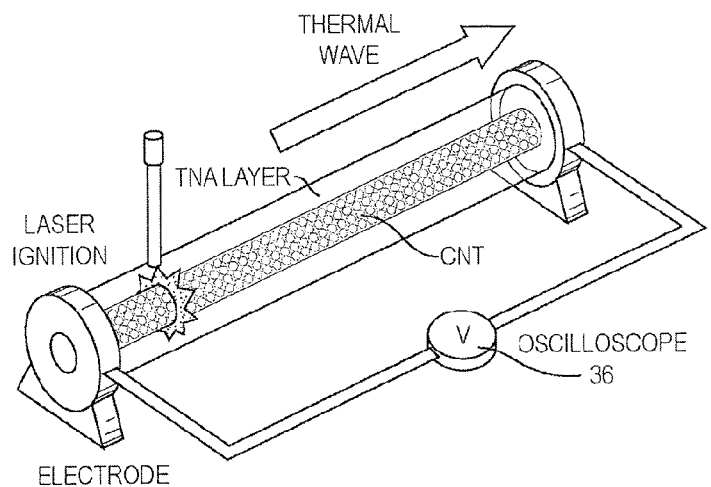

Applicants have discovered that this directional thermal wave evolves a corresponding electrical energy wave (herein referred to as a "thermopower wave") along the same direction as the thermal wave, e.g., in the form of a high specific power electrical pulse of constant polarity. With reference to FIG. 5, such an electrical pulse can be observed, e.g., by electrically contacting an oscilloscope 36 across a carbon nanotube coated with a chemically reactive material (or an array of carbon nanotubes coated with a chemically reactive material as discussed below).

Figure 6:
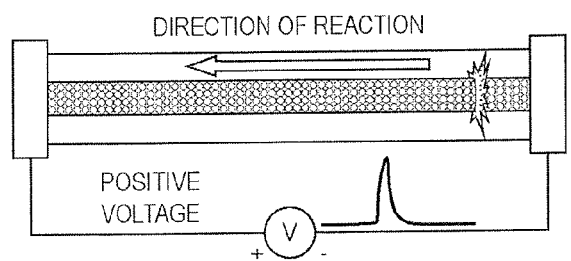
FIG. 6 shows a measured positive voltage pulse generated in a system according to the invention by initiating a chemical reaction in a chemically reactive coating of a plurality of multi-walled carbon nanotubes, FIG. 7 schematically depicts an exemplary implementation of a system according to an embodiment of the invention that includes an array of multi-walled carbon nanotubes coated with a chemically reactive composition, FIG. 8 schematically depicts an exemplary electronic device in which a system according to the teachings of the invention is incorporated as a power source, FIG. 9 schematically depicts a system according to another embodiment of the invention for generating pulsed electrical energy, FIG. 10 schematically depicts an exemplary system according to another embodiment of the invention that includes a plurality of carbon nanotubes coated with a reactive composition and a mechanism for in-situ replenishment of the reactive coating, FIGS. 11A and 11B schematically depict a system according to another embodiment of the invention in which the decomposition of a chemically reactive coating of a plurality of carbon nanotubes produces a propulsion force, FIGS. 12A-12C schematically depict a system according to another embodiment of the invention that includes a sheet of graphene coated with a chemically reactive composition.

By way of example, as shown schematically in FIG. 6, the laser initiation of the exothermic reaction at one end of an array of coated carbon nanotubes can result in a voltage peak of the same duration as the reactive wave. The voltage wave is positive thr waves emanating from the positive electrode, indicating that the wave is generated by a pulse of majority electronic carriers traveling toward the negative electrode. This thermopower wave is distinct from conventional, static thermopower because of its anisotropic propagation. If a temperature pulse were travelling across the medium generating thermopower, the voltage pulse would change sign, showing an inflection midway and would integrate to zero over the nanotubes length. Further, in such a case, if the reaction were initiated at the middle of the nanotube, the current would reverse. In contrast, the chemically driven thermopower waves generated according to the teachings of the invention exhibit constant polarity in the direction of the reaction. Without being limited to any particular theory, these observations indicate that in the systems according to the teachings of the invention, the majority electrical carriers (e.g., electrons) are entrained in the thermal wave, thereby producing a high electrical power pulse. The electrical pulse can exhibit, for example, a specific power as large as 20 W/g.

Carbon nanotubes have a relatively low Seebeck coefficient (e.g., about 80 µV/K) compared with many conventional thermoelectric materials such as bismuth telluride (exhibiting a Seebeck coefficient of about 287 µV/K) or $Bi_2Te_3/Sb_2Te_3$ superlattices (Seebeck coefficient of about 244 µV/K), although modest increases are observed over the temperature range between about 300 K and about 930 K. Thermopower waves generated according to the teachings of the invention, however, do not necessarily require low phonon and high electron transport rates as the thermal gradient is preserved in the propagation of the wave front.

Figure 7:
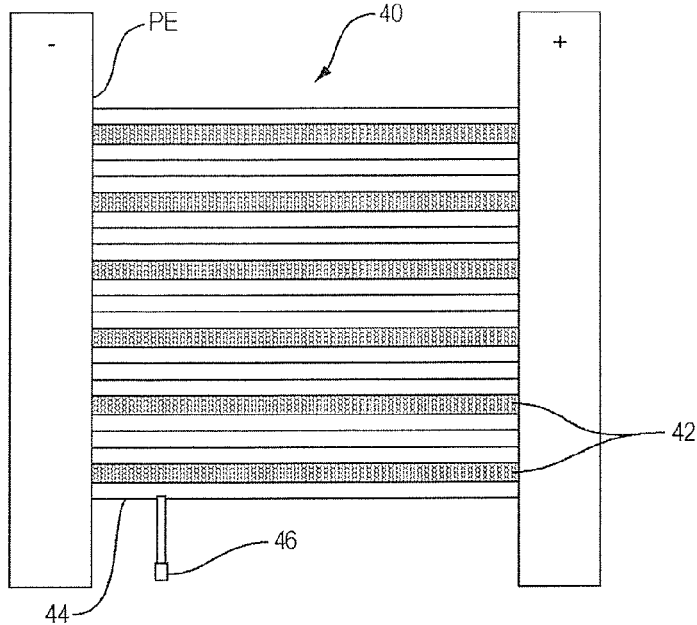

In some implementations, rather that utilizing a single nanotube that is at least partially coated with a chemically reactive material, an array of nanostructures, e.g., an array of aligned carbon nanotubes, coated with a chemically reactive material can be employed. By way of example, FIG. 7 schematically depicts an exemplary implementation of such a system 38 that includes an array 40 of carbon nanotubes 42 (e.g., multi-walled carbon nanotubes) that are substantially aligned along an axial direction (AD). A large fraction of the individual nanotubes, and preferably all of the nanotubes of the array, are at least partially coated with a chemically reactive compound 44, such as TNA discussed above, to form, e.g., a reactive shell that extends axially along the nanotubes. By way of example, in some cases, more than about 70%, or more than about 80%, or more than about 90%, and preferably 100%, of the individual nanotube strands of the array are at least partially coated with the chemically reactive material. In some implementations, the coating extends along the entire length of many, and preferably all, of the individual strands. The number of the carbon nanotubes in the array can vary from one implementation to another. By way of example, the number of the carbon nanotubes in the array can range from about 50,000 to about 50,000,000.

Similar to the previous embodiment, an ignition mechanism 46, e.g., a pulsed laser source, can initiate an exothermic chemical reaction in the chemically reactive shells surrounding the nanotubes, e.g., at a proximal end (P) of the nanotubes. The heat generated by the chemical reaction, e.g., a decomposition reaction of the chemically reactive material, can give rise to a thermal wave and a concomitant electrical pulse propagating along the array of carbon nanotubes.

The electrical pulse can exhibit a high specific power, e.g., about 2.0 W/g or higher. As discussed in more detail below, the high specific power can exhibit an inverse scaling relationship relative to the mass of the array of the coated carbon nanotubes. In other words, the specific power can increase as the mass of the array of the coated carbon nanotube decreases, e.g., over a mass range of about $10^{-2}$ mg to about 10 mg. This unusual scaling trend can be favorable for powering micro and nano-scaled devices. Without being limited by any particular theory, the reduction of the specific power as the mass of the array increases can be due to increase in orthogonal heat transfer in the array, which can degraded the axial heat transfer.

Without being limited to any particular theory, the theory of conventional combustion waves can be adapted to describe the nanotube coupled thermal wave. Consider a first order reactive annulus at dimensionless temperature u surrounding a nanotube or nanowire at temperature $u_2$ where both are thermally coupled via a dimensionless interfacial conductance, γ. The Fourier description of this system is:

$$\frac{\partial u}{\partial \tau} = \frac{\partial^2 u}{\partial \xi^2} + (1-\eta)e^{-1/u} - \gamma_1(u-u_2) \quad (1)$$

$$\frac{\partial u_2}{\partial \tau} = \alpha_0 \frac{\partial^2 u_2}{\partial \xi^2} + \gamma_2(u-u_2) \quad (2)$$

$$\frac{\partial \eta}{\partial \tau} = \beta(1-\eta)e^{-1/u} \quad (3)$$

where η is the extent of chemical conversion of the reactive annulus, $\alpha_0$ is the dimensionless thermal diffusivity of the nanotube (normalized by that of the annulus), β is the dimensionless inverse adiabatic temperature of the reactive annulus, τ and ξ are dimensionless time and distance. (Here, $\gamma_1$ and $\gamma_2$ are γ scaled by material properties of the annulus and nanotube, respectively.) A system initially at room temperature (u=0.0124 for TNA) will produce a reactive wave solution if one end is heated to ignition. Numerical solution of (1-3) demonstrates that, since the thermal conductance in the nanotube exceeds that of the reactive annulus, the reaction velocity along the nanotube component is increased substantially, directing the energy along its length. The non-linear nature of the source term causes the reaction velocity to increase disproportionately with an increase in nanotube thermal diffusivity above that of the reactive annulus, creating an amplified thermal wave. The numerical solution can be used in conjunction with the measured reaction velocities to estimate the effective thermal conductance of the MWNT (multi-walled nanotube).

Figure 8:
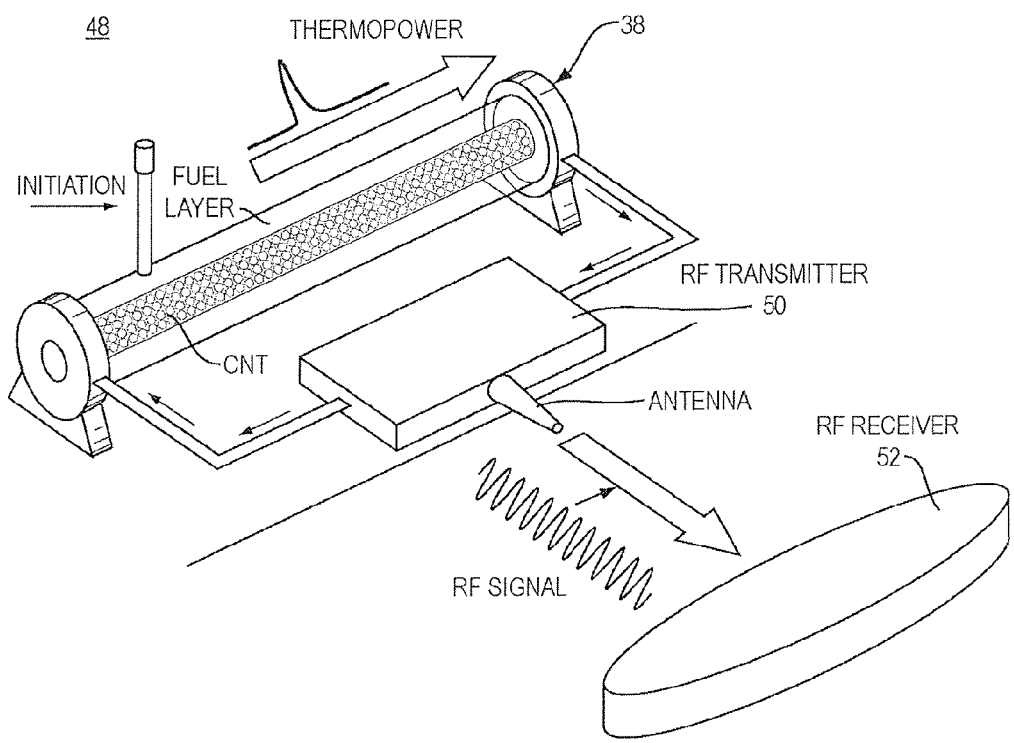

The systems according to the teachings of the invention can have a variety of applications. By way of example, the above systems 10 and 38 can be employed as power sources in a variety of devices, especially in miniaturized electronic devices. For example, the system 38 can be utilized to provide high peak power density for intermittent but high load operations, such as emission of modulated radio frequency (RF) signals. By way of example, FIG. 8 schematically depicts an electronic device 48 in which the above system 38 is incorporated as a power source to supply intermittent electrical pulses to radio frequency (RF) transmitter 50. The RF transmitter 50 converts the received electrical energy to RF energy (e.g., in the form of RF pulses), which is transmitted to a receiver 52.

The teachings of the invention can be applied to create energy storage devices having a variety of sizes. For example, thermopower wave generators can be scaled up using nanotube microstructures, such as nanotube yarns, which can be spun to meters in length. Furthermore, thermopower fuel cells can be operated to generate power continuously, and can utilize renewable fuel sources such as formic acid, methanol, etc. An exemplary closed-cycle, low-carbon fuel cell system is illustrated in FIG. 10, which is discussed in more detail below.

Figure 9:
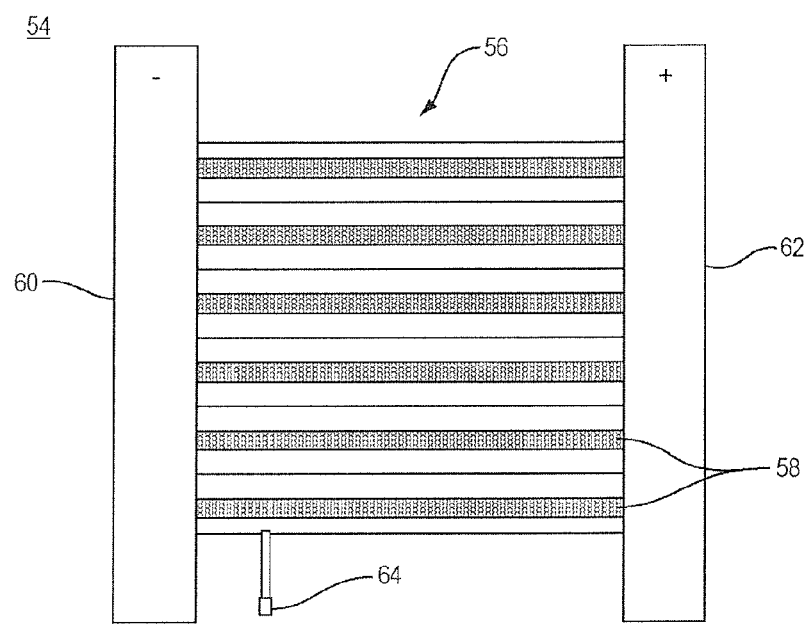

The teachings of the invention can be implemented in a variety of ways, and are not limited to the above embodiments. By way of example, FIG. 9 schematically depicts a system 54 according to another embodiment of the invention for generating pulsed electrical energy that includes an array 56 of aligned multi-walled carbon nanotubes 58 extending from a proximal end 60 to a distal end 62 along an axial direction. Rather than coating individual carbon nanotubes of the array with a chemically reactive material, in this embodiment, a coating of a chemically reactive material is applied to an outer surface of the array with the inner carbon nanotubes remaining substantially, or entirely, uncoated. Similar to the previous embodiment, an ignition mechanism 64, e.g., a pulsed laser source, can initiate a chemical reaction in the reactive coating, e.g., at the proximal end, which results in a propagating thermal wave and a concomitant electrical pulse traveling along the nanotubes in the axial direction, in a manner discussed above.

In some embodiments of the invention, the ignition mechanism and the reactive coating are configured such that initiating a chemical reaction at a location along the coating results in generating a pulse without completely depleting the reactive coating. The remainder of the coating can then be utilized to generate one or more additional pulses. Alternatively, a mechanism for replenishing the coating, e.g. in situ, can be employed to allow utilizing the same carbon nanotube (or an array of nanotubes) multiple times for generating electrical pulses. Indeed, Example 4 below demonstrates that CNTs can survive a pulse generation reaction with no detectable damage. This performance characteristic can allow a thermopower wave generator to be continually replenished and reused over time.

Figure 10:
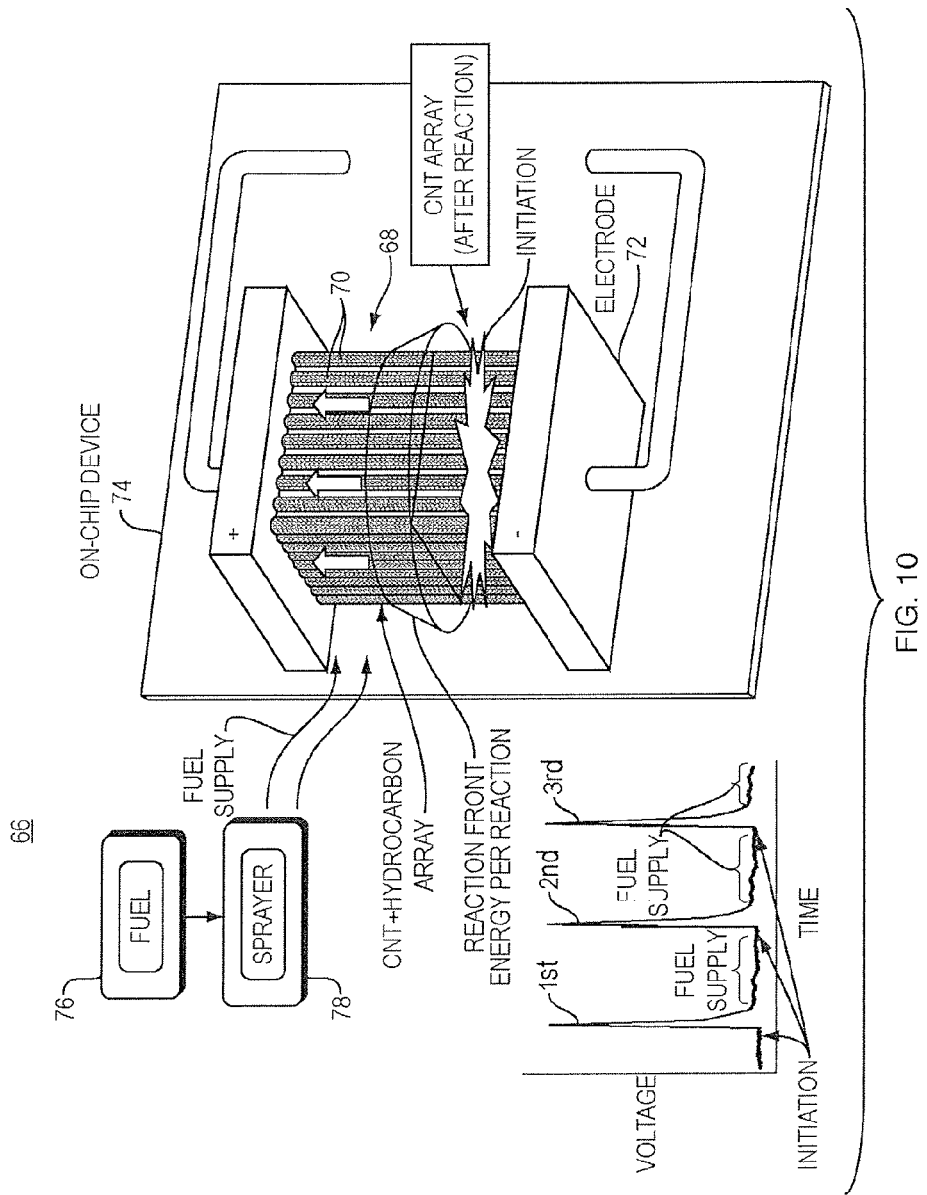

By way of example, FIG. 10 schematically depicts such a system 66 that includes an array 68 of multi-walled carbon nanotubes 70 extending axially between two electrodes 72 and 74. The carbon nanotubes are circumferentially coated with a hydrocarbon fuel, such as ethanol, isopropanol, formic acid, benzene, gasoline, or JP-8 jet fuel, which can undergo an exothermic reaction in response to activation. An ignition mechanism (not shown) can initiate a chemical reaction in the coating, e.g., at the end in proximity of the electrode 72, in a manner discussed above to generate a thermal wave and a concomitant electrical pulse propagating along the carbon nanotube. By way of example, the ignition mechanism can include a pulsed laser that applies a pulse of radiation to the reactive material to initiate a chemical reaction therein. In this implementation, the system can include a fuel reservoir 76 that can replenish the consumed coating to allow generating additional electrical pulses via subsequent activation of the coating. By the way of example, the fuel from the reservoir can be sprayed onto the carbon nanotubes via a spray mechanism 78 to replenish the coating, thereby allowing the generation of the subsequent electrical pulses.

In some implementations, the coating of the chemically reactive material is not completely consumed via generation of the first pulse, thus allowing the remainder of the coating to be utilized for generating the subsequent pulses. By way of example, the energy of the first laser pulse as well as the type and the thickness of the coating can be configured such that the initiated chemical reaction consumes only a portion of the reactive coating. Subsequently, a second laser pulse can initiate the chemical reaction in the remainder of the coating. This process can be repeated until the entire coating of the chemically reactive material is consumed. Alternatively, the system can also include a replenishment mechanism, such as sprayer 78, to reapply a fuel or other reactive composition to the nanotube(s) following the generation of a pulse. For example, in some embodiments, the system can include a syringe filled with a fuel solution, such as formic acid, and a syringe pump configured to apply the solution to the tubes.

The chemical reaction initiated in the chemically reactive compound can also generate a pressure wave of high energy density. By way of example, the rapidly expanding, gaseous decomposition products from the thermal wave can create a strong pressure pulse that is highly anisotropic. In other words, the pressure pulse provides a thrust along the axial direction of the carbon nanotube(s). Such an anisotropic pressure wave can be utilized in a variety of systems, such as microthrusters, microactuators, chemical synthesis for micro-nano size, micropyro valve or explosive bolts or other connectors.

Figure 11A:
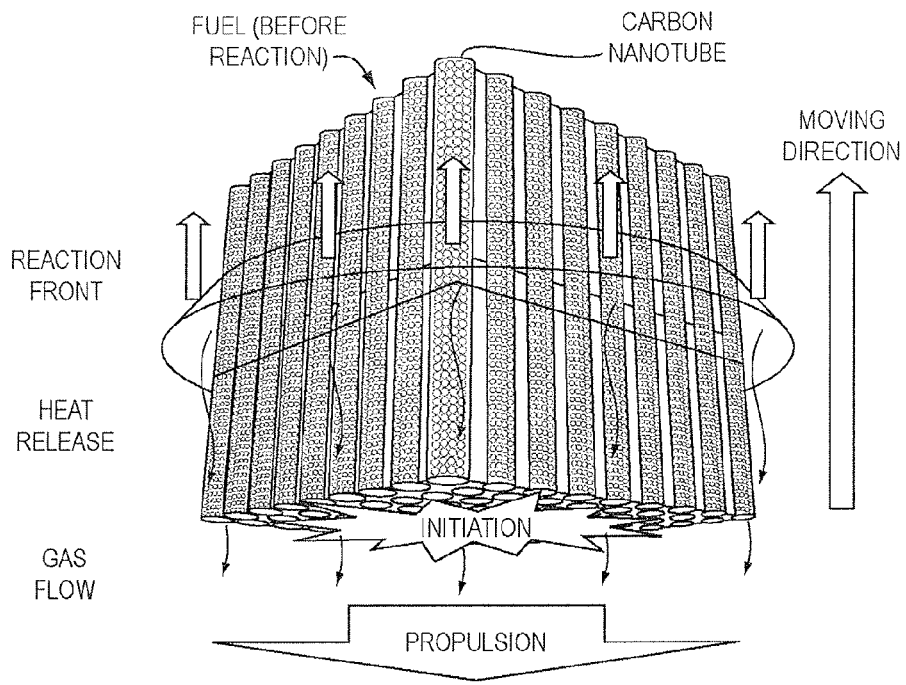
Figure 11B:
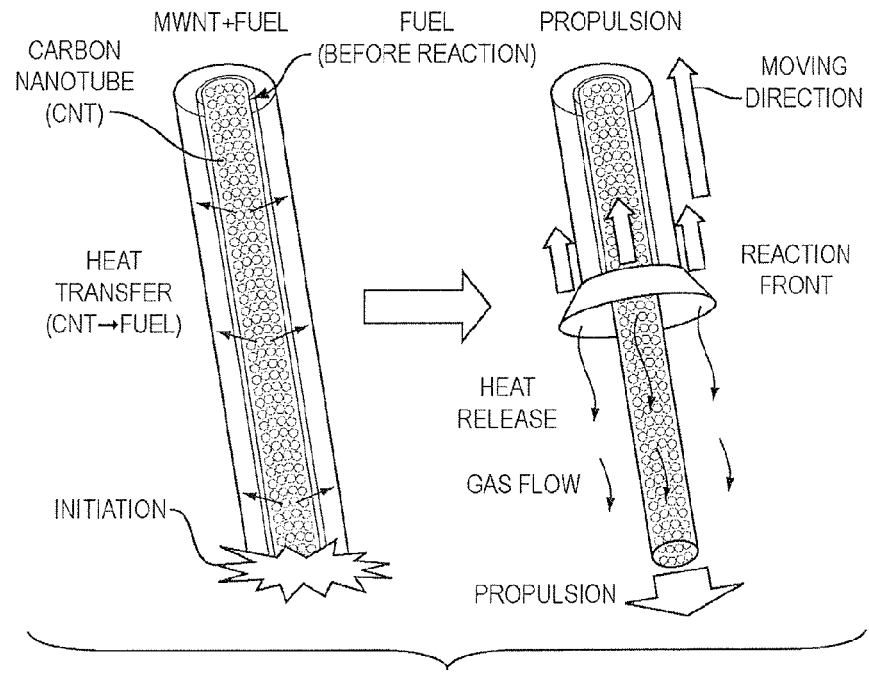

By way of example, with reference to FIGS. 11A and 11B, a plurality of multi-walled carbon nanotubes can be coated with a chemically reactive compound, e.g., in a manner discussed above. The initiation of a reaction in the compound at one end of the carbon nanotubes can initiate an exothermic chain reaction in the coating of each coated carbon nanotube, which in turn results in a reaction wave propagating along the nanotube, as shown schematically in FIG. 11B. The rapidly expanding gas generated as a result of the exothermic reaction generates a pressure wave that propels that carbon nanotube along a direction opposite to the direction of the propagating reaction. As discussed above, this propulsion force can be utilized in a variety of systems, such as microthrusters.

In some embodiments, a thermopower wave generator according to the teachings of the present invention can employ a catalyst to aid in the reaction of a fuel, such as a liquid fuel, and the creation of thermopower waves. The catalyst can have a variety of forms, but in some embodiments can be metal nanoparticles added to the CNT thermoelectric conduits. In some embodiments, the metal nanoparticles or other catalyst(s) can lower the activation energy of the reactive composition or fuel, thereby lowering the energy required for igniting the fuel. For example, Applicants have demonstrated that the addition of a catalyst, such as Au metal nanoparticles, to a liquid fuel, such as formic acid, ethanol, hexane, and toluene, can greatly facilitate ignition of the fuel to generate a self-propagating thermopower wave. In some cases, the ignition of such fuels in the absence of the catalyst(s) may render generation of a self-propagating thermopower wave impractical (e.g., due to the high activation energies required for ignition). This discovery can allow thermopower wave generators to be used as an entirely new type of fuel cell with traditional liquid fuel sources, e.g., gasoline, while providing some of the highest energy and power densities attainable. In some embodiments, the energy density can be above 40 W/g and the power density can be above 2.2 MJ/kg.

A number of materials can be employed as catalysts. For example, Applicants have demonstrated successful thermopower wave generation using formic acid and methanol as a reactive composition in combination with Au nanoparticles as catalysts.

Nanoparticles of noble metals such as Au, Ag, Pt, or Pd can be grown on CNTs by electrodeposition or synthesized separately in solution and subsequently deposited on a nanotube, as described in Example 5 below.

Catalyst(s) can be chosen to optimize the activation energy; too low and the fuel will react spontaneously without being controlled by the nanotubes, too high and the required initiation energy will be too large, sapping the efficiency. Additionally, although metals like Pt, Ru, and Pd are the most active, they are also quite rare and therefore expensive. Thus, for liquid-fueled-generators to be practical, the use of more common metals like Au, Fe, or Cu can be preferable so long as their activity is sufficient. These methods favor the formation of formate species on the catalyst surface, generally the rate-limiting step of the fuel decomposition, thereby lowering ignition energy and accelerating reaction to promote thermopower waves.

In some embodiments, the activation energy of a fuel can be determined not only by the composition of catalyst nanoparticles, but also by their form and their amount relative to the mass of CNTs and of the fuel. Some suitable exemplary shapes of the nanoparticle crystalline structure include tetrahedral, spheres, cubes and octahedral shapes. The amount of catalyst could be a limiting factor if fuel molecules must diffuse too far to reach a catalyst particle. Finally, different catalysts could be deposited, together or subsequently, to obtain mixtures with precisely tuned average properties. In some embodiments, the catalyst mass can be, e.g., about 1% to about 20% of the mass of carbon nanotubes.

Figure 12A:
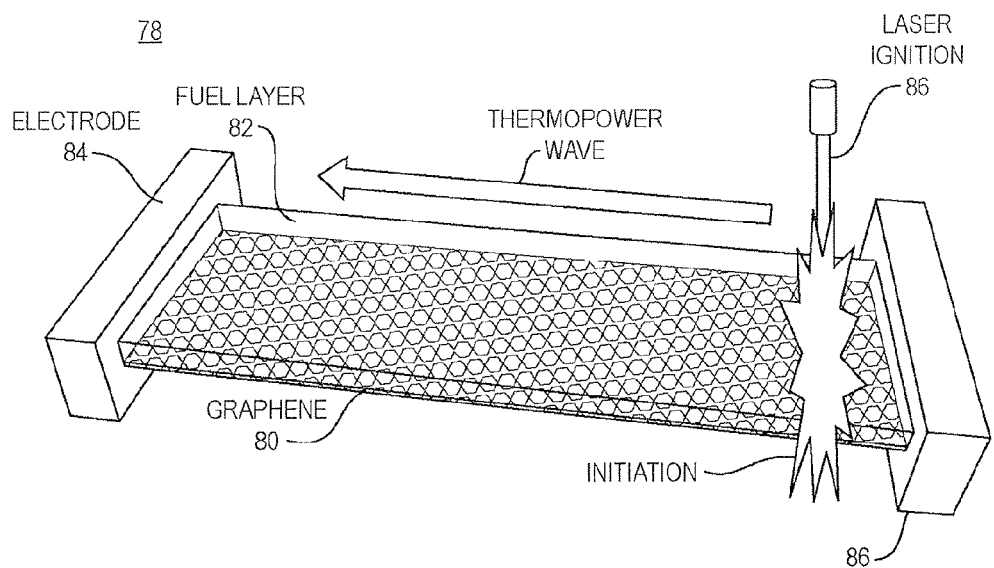
Figure 12B:
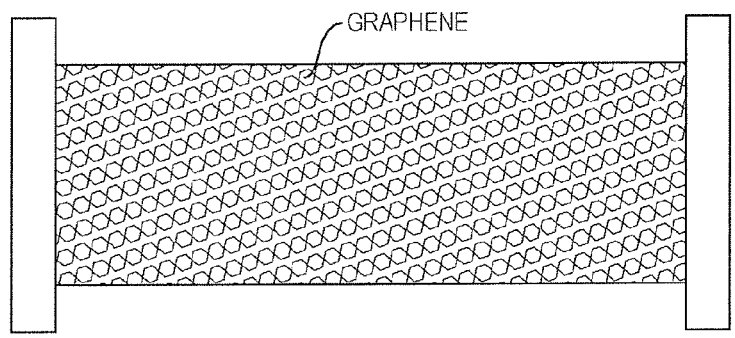
Figure 12C:
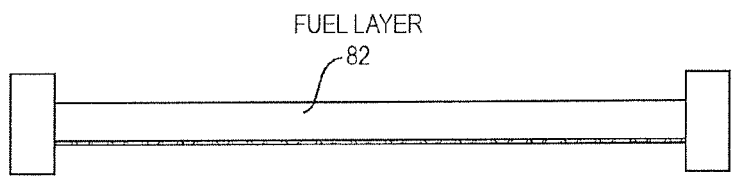

Although the above exemplary embodiments are implemented by employing carbon nanotubes coated with a chemically reactive compound, in other embodiments a sheet of a material exhibiting the requisite thermal and electrical conductivities can be coated with a reactive compound to convert the chemical energy stored in the coating into one or more electrical pulses. By way of example, with reference to FIGS. 12A, 12B, and 12C, such a system 78 can include a sheet of graphene 80 that is coated with fuel layer 82 formed of a chemically reactive material, such as TNA. The coated sheet extends longitudinally between two electrodes 84 and 86. The sheet can have a thickness in a range of, e.g., about 0.5 nm to about 25 nm. The lateral dimensions of the sheet can be selected for a specific application. By way of example, the sheet can have a length in a range of about 10 nm to about 1 cm and a width in a range of about 10 nm to about 1 cm. An ignition mechanism 86, e.g., a pulsed laser in this implementation, can initiate a chemical reaction in the coating at one end of the sheet in proximity of one of the electrodes, which results in generation of a thermal wave and a concomitant electrical pulse propagating along the length of the sheet to other electrode. Although in this implementation a graphene sheet is utilized, more generally, a sheet of a material exhibiting a thermal conductivity equal to or greater than about 1000 W/m/K and an electrical conductivity equal to or greater than about $10^7$ S/m in the plane of the sheet, or at least along one dimension of the plane (e.g., the longitudinal direction in this case), can be employed.

Systems and devices according to the teachings of the present invention can have unique voltage-generating capabilities not seen in other types of fuel cells or generators. To date, the extent to which the electrical properties of thermopower waves can be explained conventionally by the thermoelectric Seebeck coefficient, Γ (which is generally measured as the ratio of voltage generated per steady-state temperature difference), has been unclear. One indication that thermopower wave voltage is generated by more than the temperature difference between two contacts is that the magnitudes of voltage peaks can be quite large, e.g., up to 220 mV for cyclotrimethylene-trinitramine on a multiwalled carbon nanotube, and up to 150 mV for nitrocellulose on $Bi_2Te_3$. In addition, for rapid waves initiated at one end of a macrostructure collection (i.e. an array, fiber, or yarn) of carbon nanotubes, the voltage profile is typically of the form of a single-polarity pulse. Furthermore, thermopower waves can exhibit voltage oscillations with frequency spectra closely matching those of wave velocity oscillations modeled by thermal transport equations.

Despite their large electrical conductivities, single walled nanotubes (SWNTs) can have useful Seebeck coefficients at room temperature (about 40 µV/K). In SWNT macrostructures, the larger Seebeck coefficients have been attributed to loose contacts between individual nanotubes and bundles, that is, junction resistance can play a significant role. In individual SWNTs, however, phonon drag effects are important to thermoelectricity beyond carrier diffusion processes alone. Quantum-confined materials such as nanotubes can enhance phonon drag because the motion of phonons and charge carriers is more aligned, so phonon momentum can be efficiently transferred to charge carriers.

Other experiments have demonstrated additional unusual thermoelectric properties in carbon nanotubes. For example, interactions with metal catalyst nanoparticles left over from the growth process can contribute to what is known as the Kondo effect, which is a large peak in the Seebeck coefficient. However, the temperature range of this peak, from about 70 to 100 K, is far below the reaction temperatures of thermopower waves (>1000 K). Without being limited to any particular theory, the difference between the temperature ranges of the Kondo effect and thermopower waves indicates that the Kondo effect does not explain the behavior observed with thermopower waves.

However, thermopower in nanotubes can be environmentally sensitive. For example, the sign of the Seebeck coefficient can reverse when nanotubes are depressurized or thermally annealed. This effect can be attributed to the removal of ambient oxygen, which can p-dope the SWNTs. Other adsorbed molecules, particularly aromatic hydrocarbons, can shift the Seebeck coefficient of SWNTs by as much as 8 µV/K with only monolayer coverage. It has been theorized that the adsorbates create a new scattering channel for carriers. The carriers in SWNTs can couple strongly to π states in adsorbed molecules, thereby enhancing their effects. Example 6 provides a more detailed analysis of the unique electrical properties of thermopower waves.

The following Examples are provided to further illustrate the salient features of the invention and are not intended to necessarily indicate the optimal ways of practicing the invention or optimal results that can be obtained.

Example 1

Synthesis of Vertically Aligned Multi-Walled Carbon Nanotubes

Vertically aligned multi-walled carbon nanotubes (VAMWNT) were synthesized, in a horizontal quartz tube furnace with an inner diameter of 29 mm, by the chemical vapor deposition (CVD) method. Catalyst layers, 0.5-1 nm Fe and 10 nm $Al_2O_3$, were deposited on a silicon wafer by electron beam evaporation. Ethylene ($C_2H_4$) was the carbon source. Hydrogen ($H_2$) and argon (Ar) were used as catalytic and carrier gas. The gases were preheated by a tungsten filament (12~14 amps) to induce the decomposition of the hydrocarbon. The key steps in this fabrication process are described below.

a. For 28 minutes, the furnace temperature was increased from 25 to 750° C. with Ar gas flow (400 sccm).

b. Next, the temperature was maintained at 750° C. for 10 minutes while $H_2$ (100 sccm) and Ar (400 sccm) were injected. During this process, the Fe layer changed form to Fe nanoparticles.

c. $C_2H_4$ (147 sccm), $H_2$ (100 sccm) and Ar (400 sccm) were introduced into the furnace at 750° C. and 1 atm. Bubbling water (50 sccm) was injected for 1 minute every 15 minutes or continuously to decrease amorphous carbon production and increase the length of MWNT (S1). Scanning Electron Microscopy confirmed that the final lengths of MWNT were similar and that pulsed water injection resulted in well aligned VAMWNT.

d. At the end of the CVD process, the Ar flow rate was decreased to 50-100 sccm in order to weaken bonding between the MWNT array and substrate and create a free standing aligned MWNT array. The resulting films were 3 to 5 mm tall on a silicon wafer approximately 5×5 mm in cross-section. The MWNT were either dispersed as individual nanotubes for characterization or kept in an array form for further reaction testing. We calculated the porosity of the VAMWNT using a previously published protocol. The mass and volume of the VAMWNT were measured directly. The information about tube diameter and number of walls was obtained from TEM images. The 22 nm-MWNT had an average of ten walls, an inner radius of 7.6 nm, and an outer radius of 11 nm, giving them a cross-sectional area of 197.6 $nm^2$. The porosity was estimated as 99%. Alternative growth conditions (Furnace tube diameter: 29 mm, Fe:0.5 nm, $Al_2O_3$:20 nm, $C_2H_4$:30 sccm, $H_2$:55 sccm, Ar:150 sccm) produced 13 nm-diameter MWNT with an average of nine walls. The inner radius was 3.4 nm and outer radius was 6.5 nm. The cross-sectional area was 96.4 nm2 and the porosity was 97%.

Example 2

Synthesis and Characterization of TNA-MWNT

Figure 22:
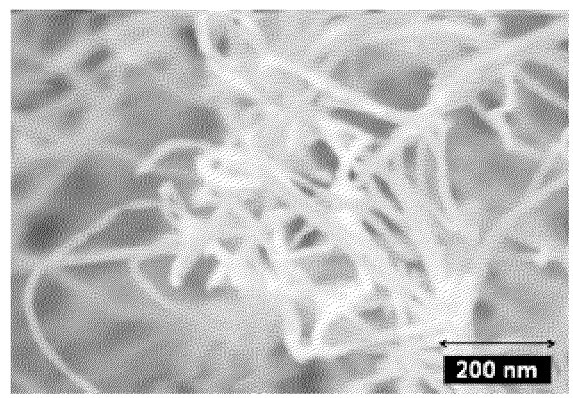
FIG. 22 depicts multi-walled carbon nanotubes coated in cyclotrimethylene-trinitramine (TNA).

TNA was received in a sand mixture. The mixture was washed with acetonitrile dissolved TNA. The solution was filtered to eliminate impurities, resulting in pure TNA solution. In particular, 0.2 grams of TNA was dissolved in 10 mL of acetonitrile. The solution was added to VAMWNT. When liquids are introduced into sparse VAMWNT and evaporated, the cross-section of the VAMWNT significantly shrinks due to the surface tension of the liquid and strong van der Waals interactions between nanotubes. Thus, TNA was trapped among the MWNT and coated their walls. The aligned structure of TNA-MWNT was maintained after wet impregnation. The TNA shows up as a bright coating compared to the nanotubes, as shown in FIG. 22. 5 µL of $NaN_3$ in aqueous solution with a concentration of 50 mg/mL, was then added to serve as a primary igniter, since $NaN_3$ has a much lower activation energy (40 kJ/mol) than TNA (140-180 kJ/mol). The VAMWNT were dried under atmospheric conditions (300 K, 1 atm) for 24 hours. The mass of the array was measured with a microbalance, before and after impregnation, to determine the mass ratio of TNA to MWNT. The mass ratio can be controlled by the concentration and amount of TNA solution added to the VAMWNT.

Example 3

To illustrate the feasibility of generating multiple electrical pulses by utilizing the same set of carbon nanotubes, a prototype system was fabricated that included a plurality of multi-walled carbon nanotubes (MWNT) coated with TNA. TNA was coated on several separate positions on MWNT discontinuously, and each ignition caused the chemical reaction only in a specific region of MWNT. After an ignition at one position, TNA coating at other positions was not ignited due to the discontinuity in coating. Hence, the reaction can be initiated multiple times, creating a voltage pulse each time.

Figure 13A:
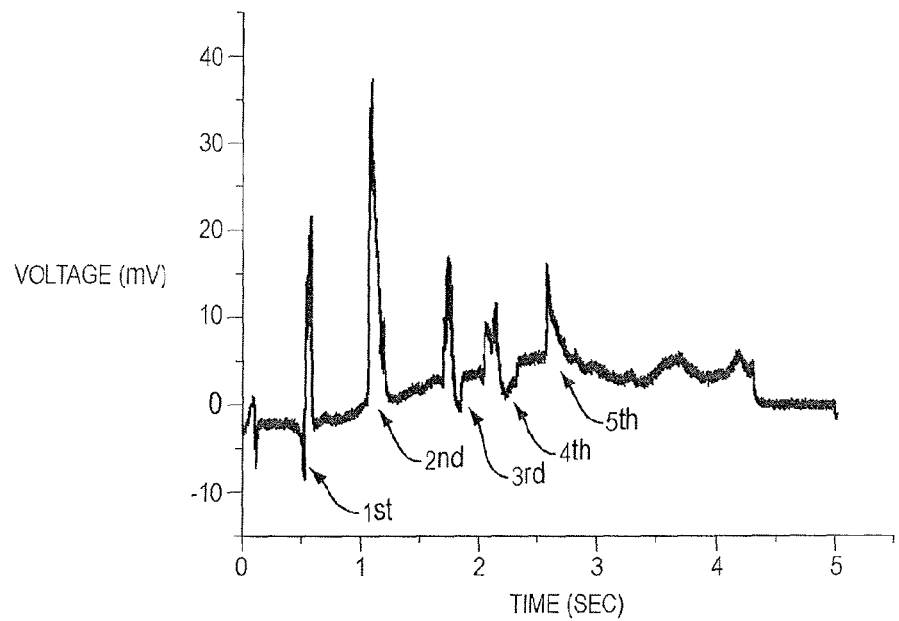
FIGS. 13A and 13B depict measured multiple voltage pulses generated in a prototype system according to an embodiment of the invention.
Figure 13B:
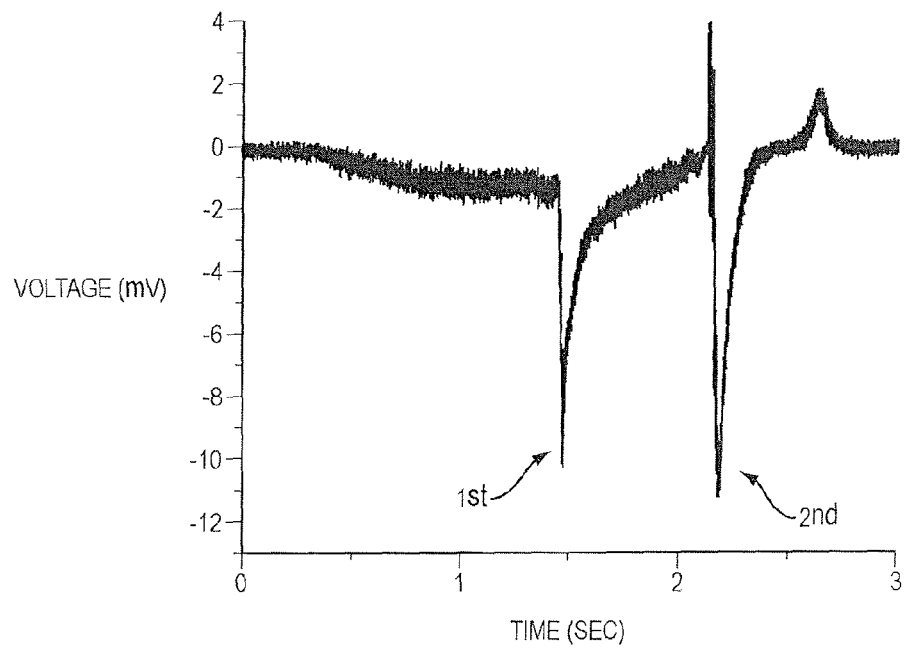

By applying successive pulses from a laser operating at a wavelength of 785 nm and a pulse power of 400 mW to the one end of the coated carbon nanotubes, a plurality of electrical pulses were generated as shown in FIGS. 13A and 13B. More specifically, after the first reaction, the carbon nanotube array survived with a portion of the fuel coating remaining on the array. By repetitive initiation of the chemical reaction in the coating, the remainder of the fuel coating was consumed to generate multiple electrical pulses. As shown in FIGS. 13A and 13B, both negative and positive voltage peaks were generated repeatedly without the change of the carbon nanotube array. The system can be modified to allow supply of fuel to the carbon nanotubes, e.g., to extend the number of electrical pulses that can be generated by utilizing the array.

Example 4

Figure 14:
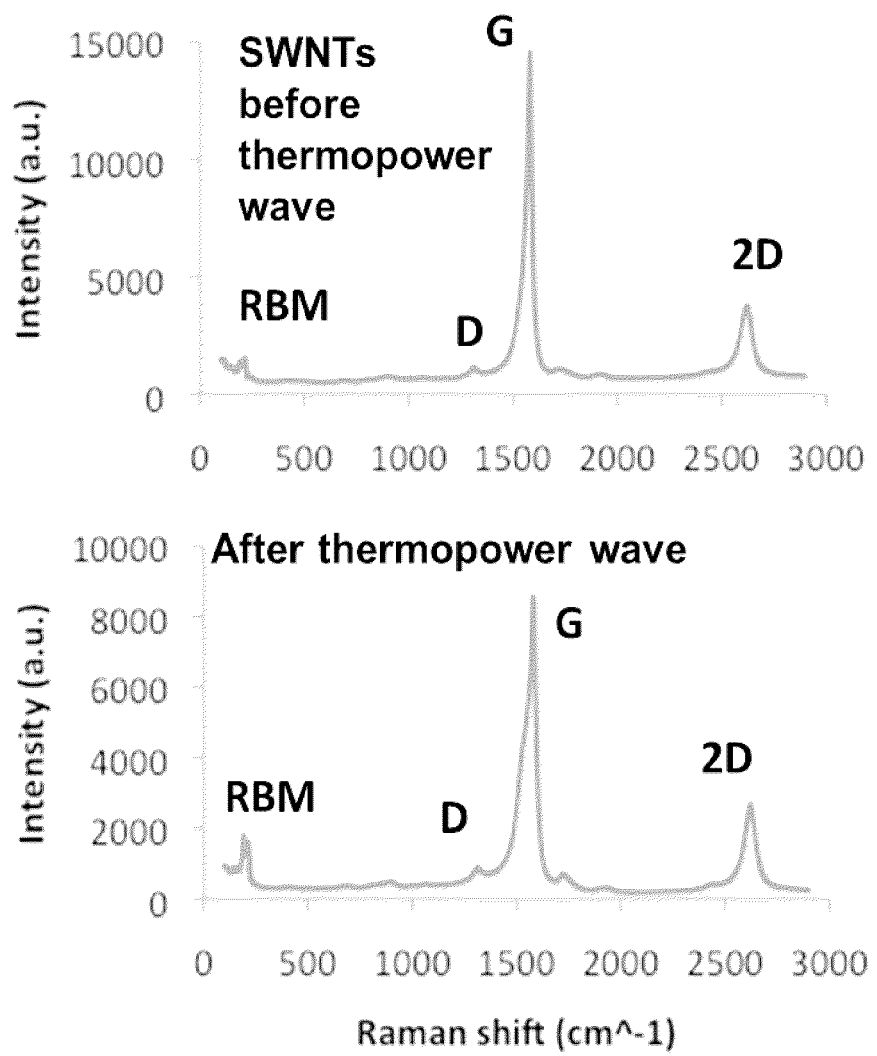
FIG. 14 depicts a spectrometry result for carbon nanotubes before and after the generation of a thermopower wave.

To illustrate the effect of thermopower wave pulse generation on carbon nanotubes, Raman spectroscopy can be utilized. Specifically, the vibrational D mode can be measured, which is a characteristic of defects in graphene lattice structures like CNTs, and can be compared to the vibrational G mode, which is a characteristic of in-plane stretching of carbon bonds in the lattice (i.e., along the length of a CNT). As shown in FIG. 14, the D/G ratio changes very little after one thermopower wave, even though CNTs are expected to oxidize at least somewhat at the measured reaction temperature of ~800° C. in air. While not being bound to any particular theory, one explanation may be that the expanding wave of gases produced by the thermopower reaction displaces the air, creating an $O_2$-poor local environment. Alternatively, secondary reactions with these product gases may rapidly consume $O_2$ in the vicinity of the CNTs.

Example 5

Figure 15:
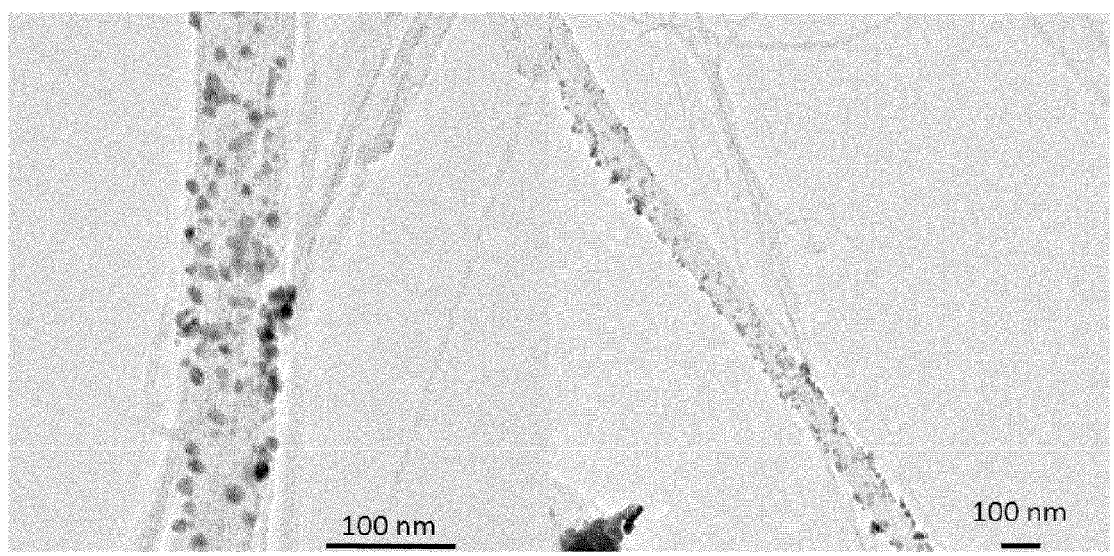
FIG. 15 depicts Au nanoparticles electrodeposited on carbon nanotubes.

The electron microscope images in FIG. 15 show Au nanoparticles electrodeposited on SWNTs (imaging potential of 200 kV). Deposition was conducted at 12V for 30 minutes, resulting in particles with an average diameter of 13 nm having triangular facing. The nanotubes appear as dispersed bundles due to the suspension process used to prepare samples for electron microscopy. As mentioned above, thermopower wave generators can be formed from SWNTs (single-walled nanotubes), MWNTs (multi-walled nanotubes), as well as from yarns, fibers, or vertically aligned arrays of any of these tubes.

Figure 16:
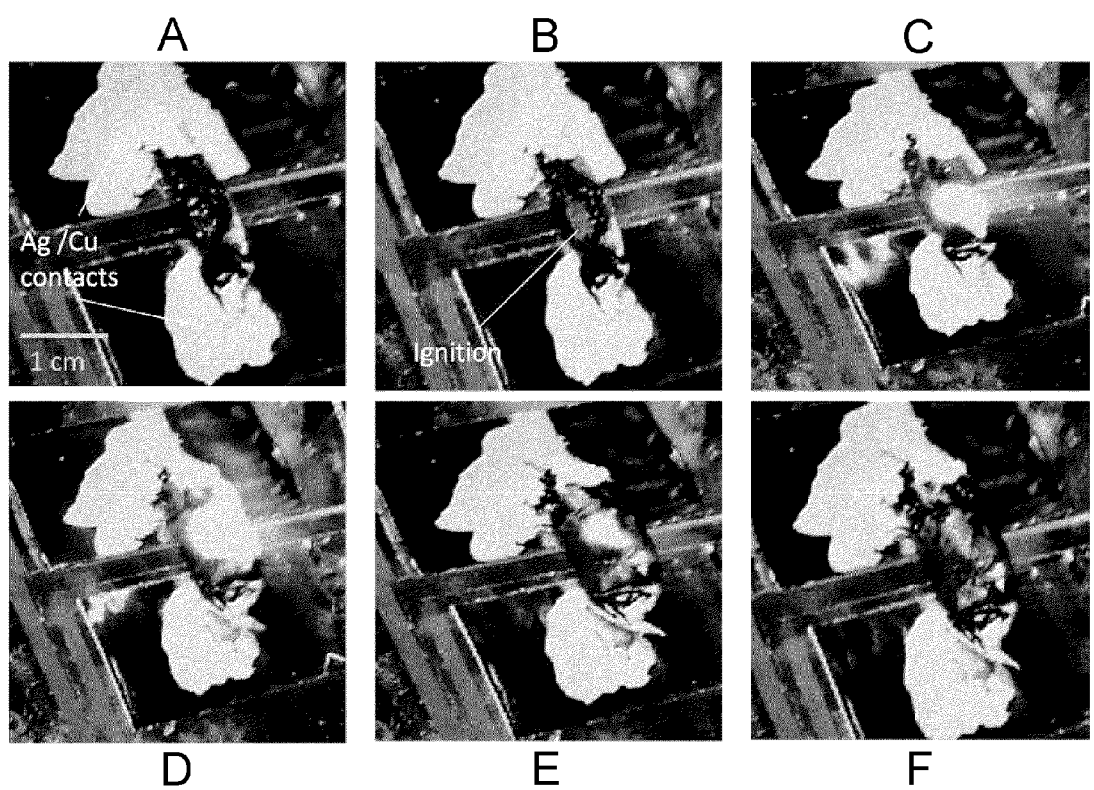
FIGS. 16A-16F depict a reacting thermopower wave generator at various times during a thermopower wave generating reaction.

When the thermopower waves propagate on Au-SWNTs, the gases evolved from fuel decomposition push apart the SWNT bundles, resulting in expansion of the generator. FIG. 16 shows a series of images from a reacting formic acid generator where this expansion occurs. The time between each image in the series is 1 second. By rearranging the SWNTs inside the generator and breaking and forming junctions, the reaction changes the SWNT fiber's electrical conductivity, which can affect the reaction efficiency. As shown especially in the bottom series of figures, the generator undergoes a physical expansion as the SWNT fibers are pushed apart. Appropriate device designs can harness the observed expansion force as useful work.

Figure 17A:
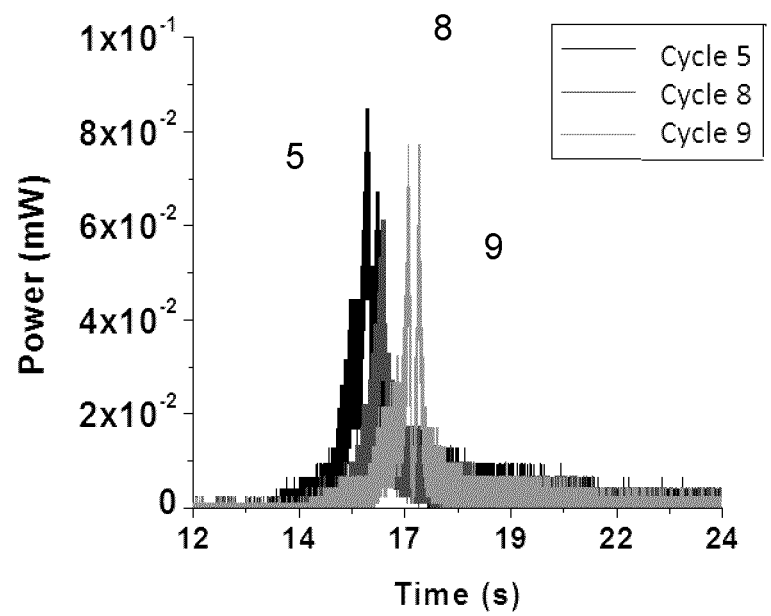
FIG. 17A depicts power measured as a function of time during cycles of thermopower wave generation.
Figure 17B:
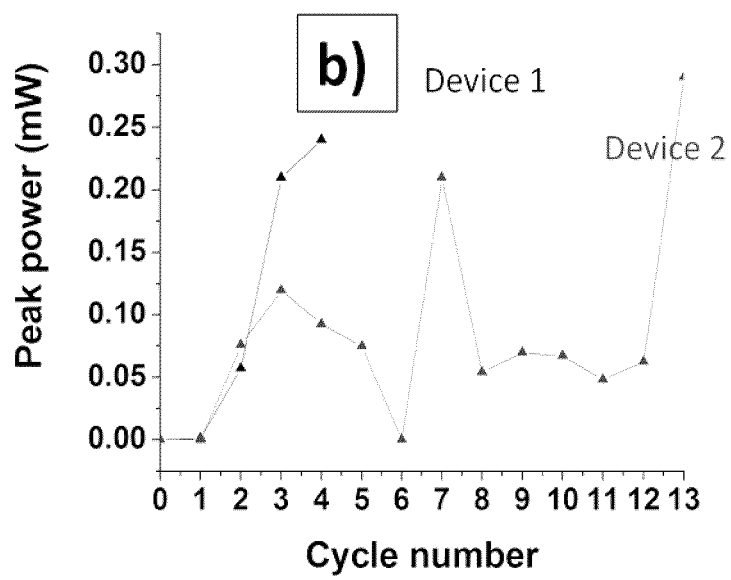
FIG. 17B depicts peak power measured over several thermopower wave reaction cycles in a thermopower wave generator according to the teachings of the invention.
Figure 17C:
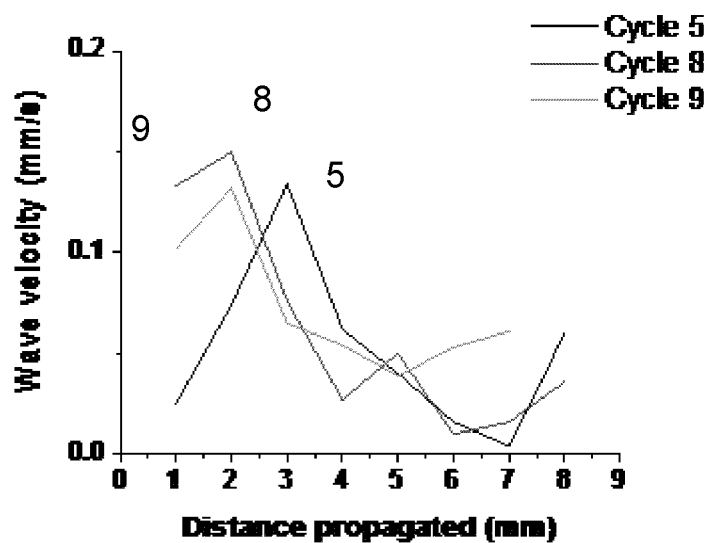
FIG. 17C depicts wave velocity as a function of propagation distance along a nanostructure for a thermopower wave generator according to the teachings of the present invention during reaction cycles.
Figure 17D:
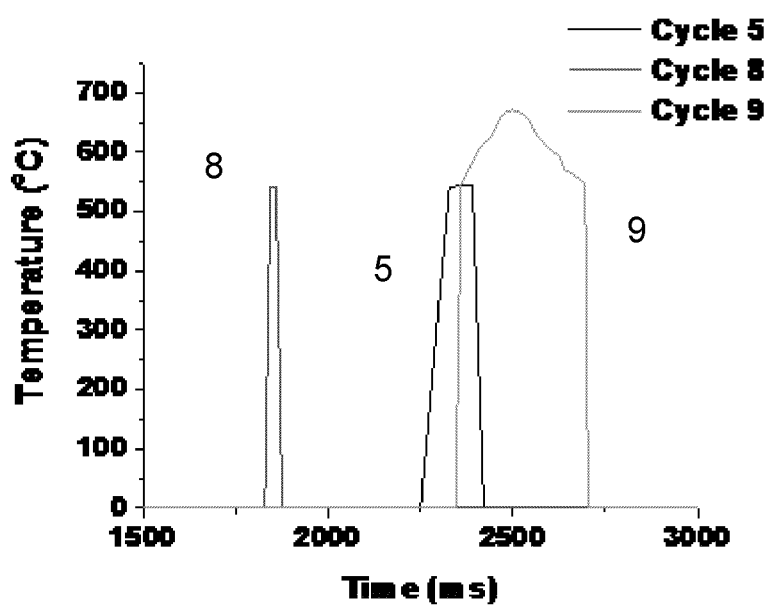
FIG. 17D depicts temperature at the proximal and distal ends of carbon nanotubes, next to the contacts, as a function of time for various reaction cycles in a thermopower wave generator according to the teachings of the present invention.

Initial demonstrations using formic acid in combination with Au-SWNTs, as shown in FIG. 17A, have measured peak power generation of 0.1-0.3 mW, which can be refueled and repeated over at least 13 cycles (see FIG. 17B). The wave front velocity, as measured by a high-speed camera, along the generator's length averages 0.6 mm/s (see FIG. 17C) fairly consistently over the cycles (only three cycles—5, 8, and 9—are shown in the graph for clarity). The reaction temperature, measured by an optical pyrometer, reached 550-650° C. (see FIG. 17D), which can vary between cycles (note that the pyrometer does not measure temperatures below 540° C., so the rises and falls below 540° appear much steeper than they actually are). The optical measurement method is preferable due to the difficulty of contacting a thermocouple to an object as small as a thermopower wave generator.

Silver paste that was applied to form strong, highly conductive electrical connections to the copper tape electrodes often flows around and among the CNTs before drying (see FIG. 16). A digital oscilloscope measured voltage generated during the thermopower wave reaction. Current and power can be calculated based on the known resistances of the thermopower wave generator and the oscilloscope circuit load. Thermopower waves can be initiated with a precisely focused laser (300 mW, 785 nm emission) or a fine-tip butane torch (~100 W).

In an exemplary embodiment, formic acid can be used as the reactive composition. Overall, formic acid decomposition proceeds by one of two pathways: dehydrogenation (producing $H_2$ and $CO_2$, $\Delta G=-48.4$ kJ/mol) or dehydration (products $H_2O$ and CO, $\Delta G=-28.5$ kJ/mol). The dehydrogenation reaction is more thermodynamically favorable but is endothermic at 300 K (+32 kJ/mol). Only when oxygen is available to react with the $H_2$ is the overall reaction (dehydrogenation plus combustion) exothermic: $-210$ kJ/mol, or $-4570$ J/g. Thus, for the most efficient reaction, oxygen must be supplied in excess, but the catalyst must also be carefully selected such that dehydrogenation is kinetically favored (since the decomposition is essentially irreversible).

Calculations from studies of thermopower wave generators have yielded an initiation threshold of 170 μg for wave propagation. This value is 4% of the aerobic reaction enthalpy of formic acid, so system efficiency must be larger than this threshold for a generator to operate continuously and indefinitely. For reaction cycle times of about 4 seconds, this efficiency corresponds to a power density of 43 W/g. While thermopower wave generators have produced impressive power densities to date, the solid fuels used react at very high temperatures, often around 800° C. Liquid fuels enable thermopower wave generators to spread into a much wider variety of applications through relatively lower temperature operation. Formic acid and methanol decomposing over metal nanoparticle catalysts on activated carbon supports, react at around 300° C., although the temperature depends on the activation energy as determined by the catalyst. Additionally, the secondary combustion of hydrogen may influence reaction temperature. These considerations may explain the higher reaction temperatures measured so far with pyrometers (see FIG. 17D).

From thermodynamics, the Carnot limit bounds the efficiency for processes generating electricity (i.e., work) from a temperature difference. A reaction temperature of 300° C. yields a Carnot efficiency of 48% (assuming 25° C. ambient temperature), which is actually on par with the efficiency of molten carbonate or solid oxide fuel cells operating at much higher temperatures (500 to 750° C.). At this efficiency, the maximum energy density of formic acid (in the limit of negligible generator system mass) is 2.2 MJ/kg, which is three times larger than lithium ion.

Example 6

Small and large thermal losses, and predictions of characteristic voltage pulse shapes for generators, can be modeled using the energy balance for thermopower waves. In particular, using end-point temperature measurements during thermopower wave reactions, the expected voltage from several temperature-dependent Seebeck coefficient models can be compared to actual measurements to demonstrate that they sometimes miss the presence of secondary peaks of opposite sign, as well as misjudge the magnitude of the primary voltage peak. By introducing to the model doping-related shifts in the sign of the Seebeck coefficient, which can be caused by oxygen removal from the SWNTs behind the reaction front, a better prediction of observed experimental voltages can be achieved.

To begin, the charge transport (sometimes called drift-diffusion) equation can be used to predict voltage from temperature models:

$$J_h = -\sigma_h\left(E + \frac{\nabla \mu}{e}\right) - L_{12}\nabla T \quad (4)$$

where J is current, σ is electrical conductivity, E is electric field, μ is chemical potential, e is the elementary charge, $L_{12}$ is an Onsager coupling coefficient, and T is temperature. Properties are written in terms of holes being the majority carrier, as is the case for SWNTs in ambient conditions, although it is possible to write an additional equation for electrons as the majority carrier by changing the sign before σ. These quantities can be expressed as multi-dimensional vectors and tensors, but in a large-aspect-ratio (>10) system of carbon nanotubes, a one-dimensional representation is reasonable. When current is small enough to be neglected (often the case for oscilloscope measurements), one can solve for E and integrate between two contacts (e.g., positioned at end points $x_L$ and $x_R$ of a nanotube) to obtain an equation for voltage.

$$V = -\int_{x_L}^{x_R} \frac{\nabla \mu}{e} + \frac{L_{12}}{\sigma_h}\nabla T dx \quad (5)$$

The Seebeck coefficient is defined as $\Gamma = \pm L_{12}/\sigma$, with the sign the opposite of the majority charge carrier. It is the ratio of V to ΔT with no other gradients present. Introducing a chemical potential gradient, e.g., through doping, can also affect charge transport. Thus, experimental measurements of voltage can include effects besides those of the temperature gradient. By applying a change of variables, one can simplify the previous integral.

$$V = -\int_{\mu_L}^{\mu_R} \frac{1}{e} d\mu + \int_{T_L}^{T_R} \Gamma dT = \frac{1}{e}(\mu_L - \mu_R) + \int_{T_L}^{T_R} \Gamma dT \quad (6)$$

In a real circuit, a counter-voltage develops through the electrodes and wires in response to the opposite ΔT in that direction. However, for thermal wave generator (TWG) contact materials at room temperature (e.g., see FIG. 10), the Seebeck coefficient of each electrode is negligible, so the counter-voltage can be neglected. Silver has Γ=1.51 µV/K, and copper has Γ=1.83 µV/K.50. If the same materials are used on both sides, Δµ=0 in this way as well. Furthermore, SWNT-silver contacts do not exhibit rectification (i.e., they are Ohmic contacts) because the work function of randomly oriented silver particles (4.26 eV) is less than that of SWNTs (4.5 eV). Voltage and current measurements of thermopower wave generators confirm this fact.

For a fiber of mixed semiconducting and metal SWNTs, the Seebeck coefficient will have a form described by the following equation:

$$\Gamma = aT + bT^{1/2}\exp[-(T_1/T)^{1/(1+d)}] \quad (7)$$

where a and b are coefficients defining the weight of metallic and semiconducting contributions, respectively. $T_1$ is a constant related to the energy barrier for carrier hopping between SWNTs, and d is the dimensionality factor (equal to 2 for SWNT macrostructures with this level of connectivity).

Describing the evolution of the temperature profile over time allows one to predict, using the Seebeck effect, the general shape of the voltage profile in time. In the case of an adiabatic, steadily propagating reaction wave, during the time of reaction, $T_R$ and $T_L$ are constant. Thus, a perfectly square voltage pulse would result from an adiabatic reaction wave according to equation (3). However, real reaction waves have thermal losses from radiation, convection, and conduction, and therefore will diverge from the logistic adiabatic wave temperature and voltage profiles. In particular, radiation should be the most significant factor because of its fourth-order temperature dependence and the reaction temperatures exceeding 1000 K.

The enemy balance for the reacting fuel, including radiation, is described by the following equation:

$$\rho C_p \frac{\partial T}{\partial t} = \chi \frac{\partial^2 T}{\partial x^2} - (\Delta H k_o Y)\exp\left(-\frac{E_a}{RT}\right) - \frac{\varepsilon \sigma_B S}{V}(T^4 - T_{atm}^4) \quad (8)$$

where t is time, x is distance, c is thermal conductivity, r is density, ΔH is the enthalpy of reaction, Cp is the specific heat (mass basis), Y is the concentration of fuel (mass basis), $k_0$ is the Arrhenius prefactor, R is the universal gas constant, $E_a$ is the activation energy, S/V is the exterior surface-area-to-volume ratio, E is the emissivity, $\sigma_B$ is the Stephan-Boltzmann constant, and $T_{atm}$ is the temperature of the surroundings.

The corresponding first-order reaction kinetics equation for solid fuel (no mass diffusion) is:

$$\frac{\partial Y}{\partial t} = -k_0 Y e^{-E_a/RT} \quad (9)$$

These equations can be non-dimensionalized by expressing temperature as $$u = \left(\frac{R}{E_a}\right)T,$$

time as $$\tau = \left(\frac{-Q k_o R}{C_p E_a}\right)t,$$

space as $$\xi = x\sqrt{\left(\frac{\rho C_p}{\chi}\right)\left(\frac{-\Delta H k_0 R}{C_p E_a}\right)},$$

and concentration as $$\frac{Y}{\rho} = y.$$

The resulting equations are:

$$\frac{\partial u}{\partial \tau} = \frac{\partial^2 u}{\partial \xi^2} + ye^{-1/u} - w(u^4 - u_{amb}^4) \quad (10)$$

$$\frac{\partial y}{\partial \tau} = -\beta y e^{-1/u} \quad (11)$$

with $w = \left(\frac{S}{V}\right)\frac{\varepsilon \sigma \beta}{\rho k_o C_p}$ and $\beta = \frac{E_a C_p}{-\Delta HR}$.

For thermopower waves, the inclusion of highly thermally conductive nano-conduits with large aspect ratios (such as carbon nanotubes) accelerates the reaction wave along their lengths. The heat transfer between fuel annuli and the conduits around which they are wrapped is not limiting, so both can attain the same temperature profile moving with a velocity determined by the thermal diffusivity of the conduit. This effect can be incorporated in Equation (6) above by multiplying the thermal diffusion term by the ratio of conduit to fuel thermal diffusivities, $\alpha_2/\alpha$. For this case, w should still use the exterior S/V for the whole composite in order to avoid the complications of representing radiation within the structure.

Equations (10) and (11) can be solved numerically with computer software, such as the COMSOL 4.1 package. Using adiabatic boundary conditions and a sufficiently large initial Gaussian temperature pulse $$u = ge^{-\frac{\varepsilon^2}{w_i}} + u_{amb}$$

can ensure self-sustaining wave propagation. Experiments have demonstrated that preheating also helps, so in one experiment the system was initialized at 350 K with unreacted fuel (y=1) everywhere. Reaction and thermal parameter values were taken from picramide, the fuel used in the experiment, except for thermal diffusivity ($\alpha_2/\alpha$), which was set by the SWNT thermal conduits as described above; $C_p$=2424 J/kg/K, $\rho$=1762 kg/m$^3$, $E_{a,b}$=121 kJ/mol, $k_0$ (Arrhenius prefactor)=1.6×107 s$^{-1}$, $\alpha_2/\alpha$=25,000. Other parameters related to radiation were defined based on values typical to SWNT fibers used in the experiment: $\varepsilon$=0.9, S/V=2900 m$^{-1}$.

Figure 18A:
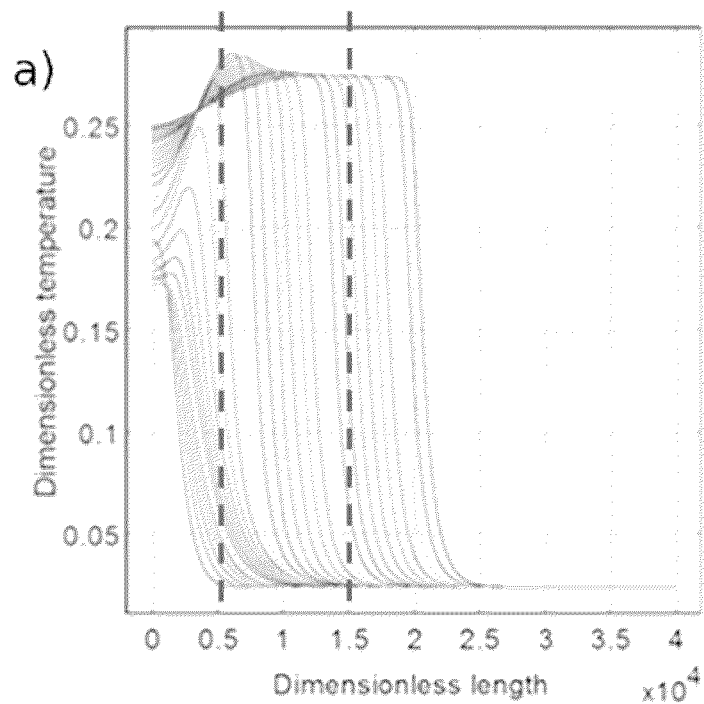
FIG. 18A depicts theoretically calculated temperature curves as a function of length along a nanostructure of a thermopower wave generator according to the teachings of the present invention, where each curve depicts temperature at a given time subsequent to the commencement of the reaction.

One goal in a thermopower wave generator is the development of a fast-moving wave with relatively low thermal losses. Reaction wave speeds decrease exponentially with increasing $\beta$, the inverse dimensionless adiabatic reaction temperature rise, but below $\beta$=2, they become unstable. Thus, an initial value of $\beta$=4 with w (dimensionless radiation coefficient)=2.7×10$^{-5}$ was used. FIG. 18A shows the propagation of this wave in the form of temperature profiles. Each profile shown represents the theoretically calculated temperature as a function of length at a different time. The wave achieves steady velocity after $\tau$=400, and differs from the adiabatic logistic form by cooling behind the front. Careful examination shows that the temperature at the left boundary monotonically increases towards the 1/$\beta$ limit as the wave moves out of the initiation regime, and the extent of cooling decreases over time. Thus, radiation actually affects the wave little at these values, and this cooling stems from conduction to the (initially) cooler left boundary region.

The computational software package used employs adaptive time-stepping to improve the stability of its calculations, and convergence can be confirmed by comparing results at several spatial mesh sizes. FIG. 18A was created with mesh size $\Delta\xi$=1, and convergence was confirmed for three other mesh sizes as well. Wave shape and speed do not change over 0.5<$\Delta\xi$<4. The simulation initiation parameters for FIG. 18 were g (initial Gaussian amplitude)=2.1 and $w_i$ (Gaussian peak width parameter)=5000.

Figure 18B:
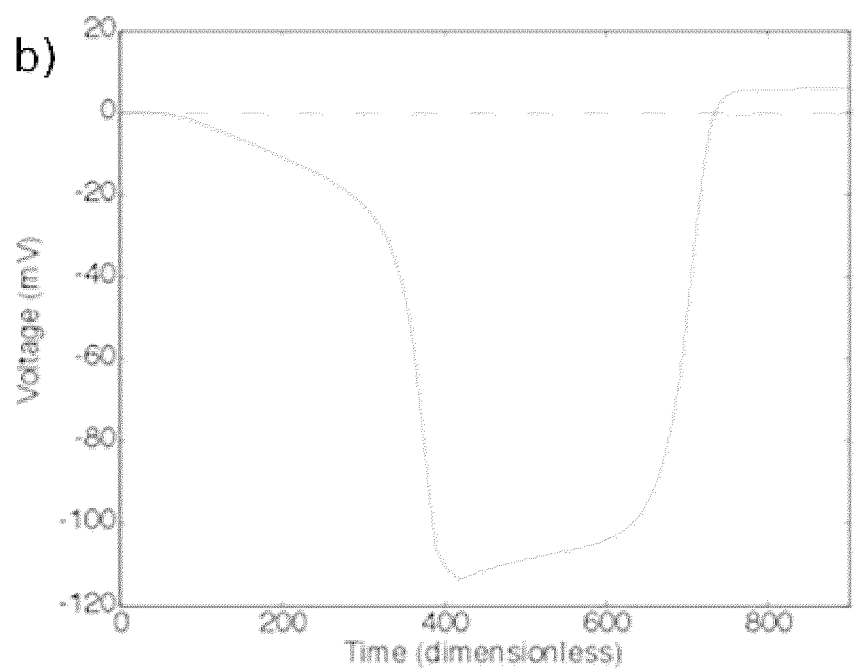
FIG. 18B depicts theoretically calculated voltage as a function of time for a thermopower wave generator according to the teachings of the present invention.
Figure 18C:
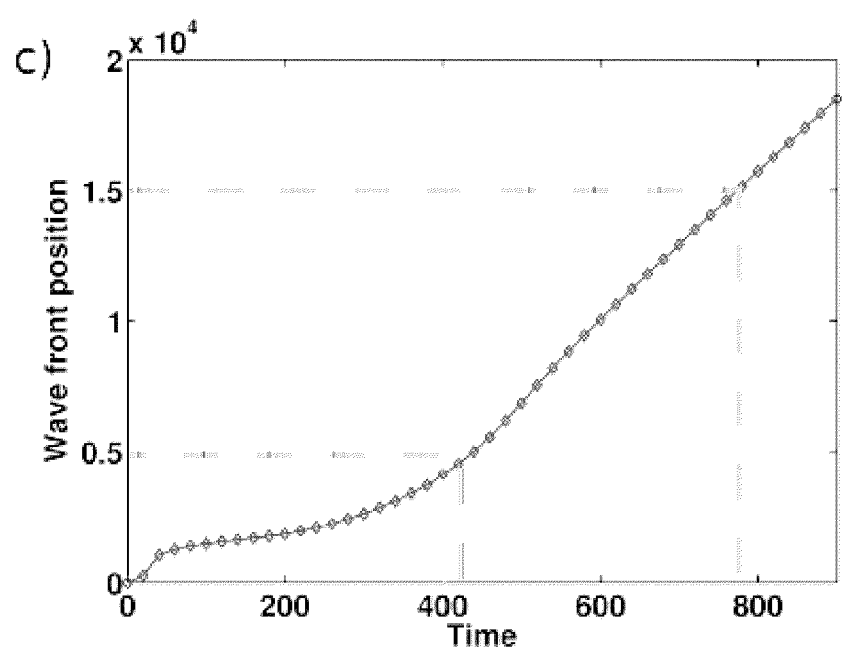
FIG. 18C depicts theoretically calculated wave front position as a function of time for a thermopower wave generator according to the teachings of the present invention.

Applying a linear extrapolation of the Seebeck model described earlier to the temperature profiles of FIG. 18A produces an upper bound for expected voltage peak shape and magnitude (assuming $\Delta\mu$=0 between the two ends), FIG. 18B shows this predicted voltage peak, measured between the dashed lines in FIG. 18A to minimize specious effects of the boundary conditions. The peak is an impressive 110 mV, but it still falls short of the record thermopower wave voltage from SWNTs (220 mV). This difference is magnified by the fact that the peak temperature of FIG. 18A, u=0.28, corresponds to 4000 K, which is about twice the maximum temperature measured in thermopower waves. Nevertheless, the shape of the pulse, which is almost entirely unipolar, generally matches that of thermopower wave pulses, with an important difference—the maximum magnitude occurs when the wave is at the left end of the zone rather than after it has finished propagating. FIG. 18C shows this clearly by delineating wave positions for the same time range of the voltage pulse of FIG. 18B (the voltage measurement points are indicated by the dashed lines).

Thermal conduction to the electrodes is another likely major thermal loss mode. In thermopower wave experiments, silver paste forms contacts between the SWNTs and copper tape electrodes. These contacts have high interfacial surface area and are generally quite massive compared to the fuel-coated nanotubes (about fitly times larger), so they can serve as large thermal reservoirs. Mathematically, such reservoirs can be represented as a Neumann boundary condition:

$$\frac{\alpha_2}{\alpha}\left(\frac{\partial u}{\partial \xi}\right) = q(u_{amb} - u) \quad (12)$$

where q will be termed the thermal flux coefficient, scaling the rate of heat loss through the boundary, which is proportional to the temperature difference between the SWNTs and the reservoir.

Figure 19A:
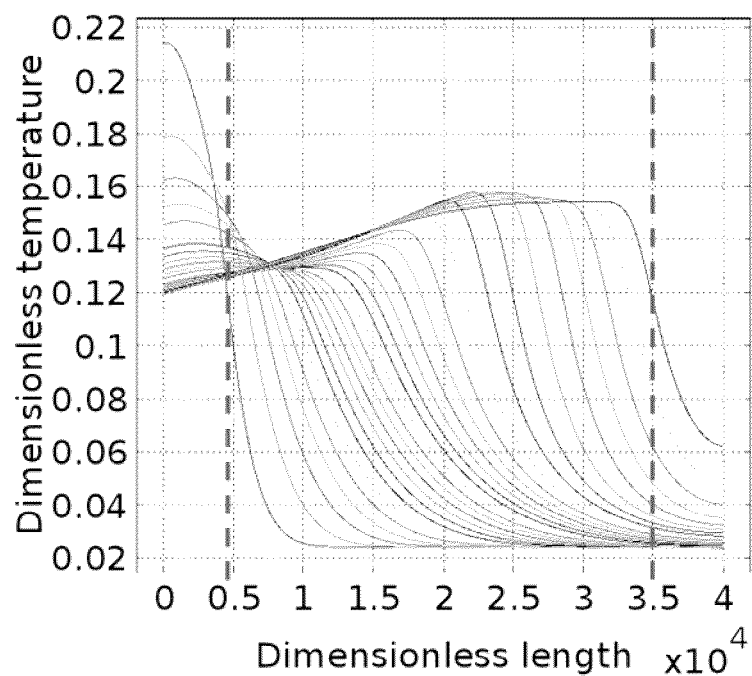
FIG. 19A depicts theoretically calculated temperature curves as a function of length along a nanostructure of another embodiment of a thermopower wave generator according to the teachings of the present invention, where each curve depicts temperature at a given time subsequent to the commencement of the reaction.
Figure 19B:
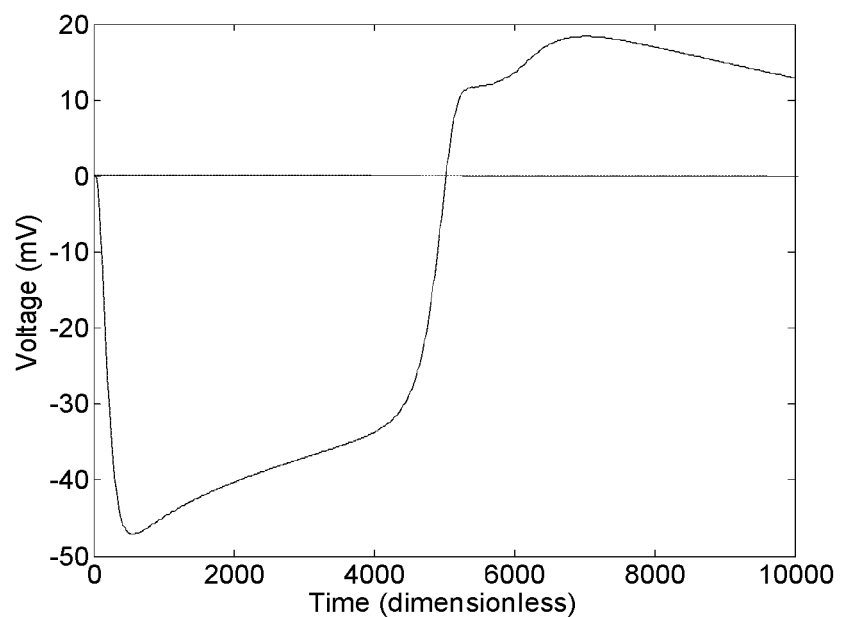
FIG. 19B depicts theoretically calculated voltage as a function of time for another embodiment of a thermopower wave generator according to the teachings of the present invention.

With conduction to the contacts and a slower moving wave, thermal losses more significantly affect the shape of the wave temperature profile. FIGS. 19A and 19B show temperature and voltage profiles (similar to FIGS. 18A and 18B) for a wave with $\beta$=8 and q=0.34, which requires g=7 to initiate propagation. The velocity is about 6% of the $\beta$=4 wave, and for this value of $\beta$,w=5.3×10$^{-5}$. FIG. 19A shows the wave start-up period as the ignition pulse dies down and the front spreads forward (from left to right) before accelerating and attaining the adiabatic reaction temperature at the front (while still cooling behind it). The wave cools to about 75% of the adiabatic reaction temperature behind the front, leading to a proportional decrease in voltage from the peak (see FIG. 19B) before the wave reaches the right contact ($\xi$=35,000). When the right contact quickly reaches reaction temperature, the thermal gradient reverses, creating the second voltage peak of opposite polarity. Note that the first voltage peak (of larger magnitude) still occurs when the wave passes the left contact. From this example, one can see that thermopower waves can exhibit bipolar voltage pulses with large thermal losses.

In the experimental setup, picramide (PA) and sodium azide together formed a fuel mixture for thermopower waves, and the mixture provided a high-temperature reaction and reliable ignition. SWNT fibers with lengths of about 5-20 mm and widths of about 0.5-2 mm were used as nanostructures. Each fiber thus contained millions of SWNTs (individuals or small bundles) with diameters of about 1.0-1.3 nm and lengths of about 5-50 μm. The fuel compounds physically adsorb to the SWNTs after deposition from their respective solutions (PA: 20 g/L in acetonitrile; $NaN_3$: 20 or 50 g/L in water). The solvents evaporate for about 1 and 4 hours, respectively, after addition of each solution. The resulting masses of PA and of $NaN_3$ can be at least as much as the mass of SWNTs for successful reaction.

A digital oscilloscope (Yokogawa DL 1735E or 2000) was used to measure voltage from thermopower waves. A high-speed camera (Canadian Photonic Labs, CPL-MS70KS2B90) recorded the wave propagation at 1000-4000 frames/second with a Nikon, AF Micro-NIKKOR60 mm f/2.8D macro lens. Two pyrometers (Raytek MM1MH and Omega OS4000) measured temperature at the left and right ends, respectively, of each SWNT fiber. The Raytek measures spectral response at 1 μm with a semiconductor photodetector and calculates temperature assuming (emissivity-adjusted) blackbody emission (accuracy: ±0.3%+1 K, range: 540° C.<T<3000° C.). The Omega uses an InGaAs photo detector (spectral response: 1.2 to 2.6 μm, accuracy: ±1%, 350° C.<T<1500° C.). Since carbon nanotubes are nearly blackbody emitters with little wavelength dependence in their emission, this approach is valid.

A 785-nm, 100-ms laser pulse (300 mW, spot size <1 $mm^2$) initiated thermopower waves after preheating to about 100° C. with a small 10-W resistance heater (which was silicone-covered to avoid current leakage into thermopower measurement circuit). Control samples with no reaction (only laser and preheating) showed voltage changes less than about 3 mV.

Figure 20A:
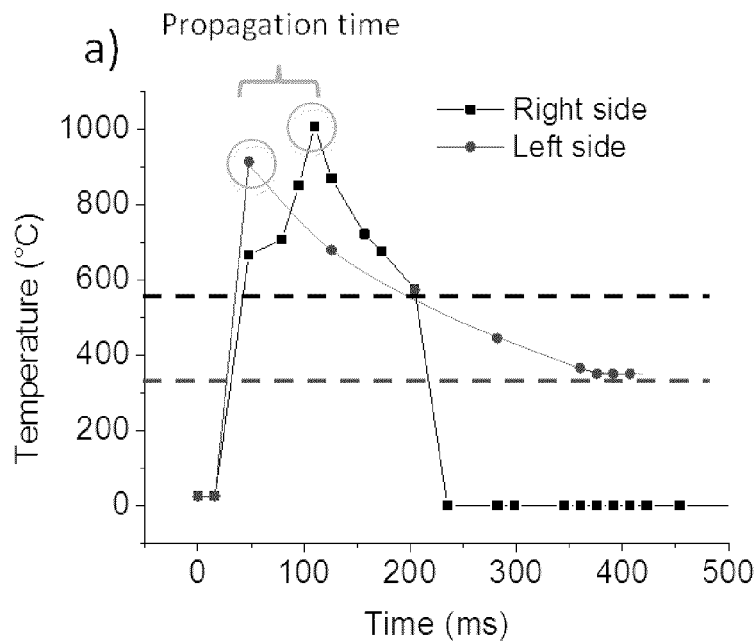
FIG. 20A depicts experimentally observed temperature at the proximal and distal ends of carbon nanotubes, next to the contacts, as a function of time for a thermopower wave generator according to the teachings of the present invention.

A 5 V TTL pulse from a custom control circuit board triggered the instruments to start with the laser pulse and stop synchronously. Synchronization was checked by comparing the timing of temperature peaks at the left and right sides to the timing of brightest reaction at each side observed with the camera. FIG. 20A depicts this method graphically for an example thermopower wave (the two pyrometers described above have different spectral ranges, so their lower measurement bounds, indicated by the dashed lines in FIG. 20A, differ). The significant cooling after the wave passes demonstrates that the system is far from adiabatic, so the Seebeck effect would predict a bipolar voltage pulse like in FIG. 19B. Note the very high maximum temperature during the reaction of about 1000° C.

Figure 20B:
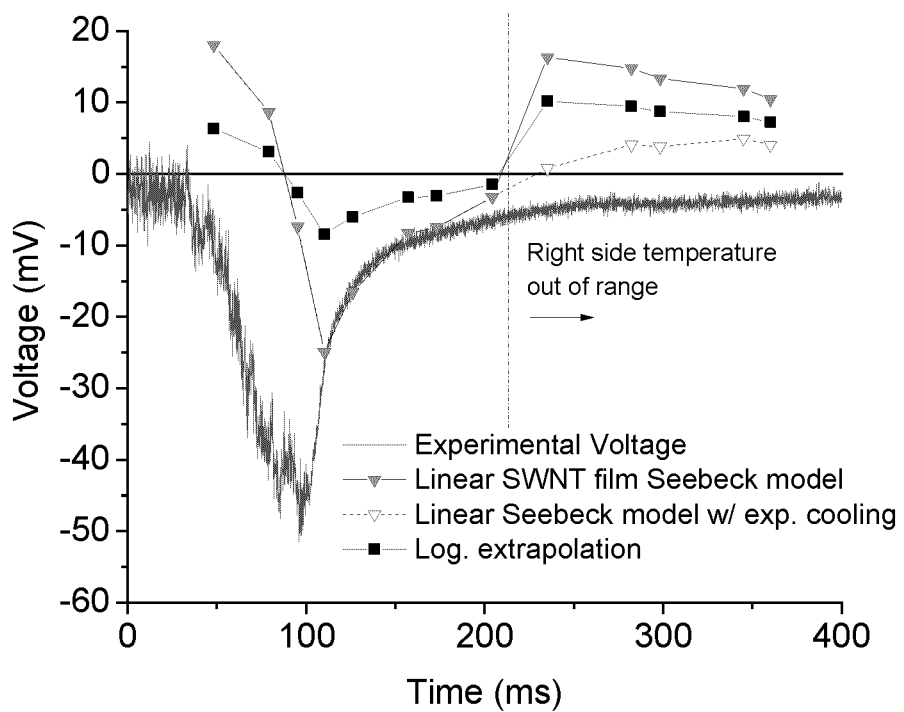
FIG. 20B depicts experimentally observed voltage between the contacts of a thermopower wave generator as a function of time, as well as theoretically calculated voltages of a thermopower wave generator according to the teachings of the present invention.

However, as is often the case for thermopower waves, the voltage pulse is unipolar, with a sizeable peak of −50 mV. FIG. 20B compares the measured voltage for this example to three different voltage models based on the temperature recorded in FIG. 20A. The pyrometers record more slowly than the oscilloscope, leading to a coarser curve of predicted voltage. Although the linear Seebeck model used in FIG. 18 and FIG. 19 generally follows the shape of the experimental voltage, it still predicts periods of opposite voltage at the beginning and end of the reaction. Moreover, it under-predicts the peak voltage by more than 20 mV. The mixed SWNTs model of Equation (7), with different temperature dependencies for semiconducting and metallic SWNTs (a=−0.022 μV/$K^2$, b=2.0, $T_1$=20 K), is more plausible based on the heterogeneous nature of the SWNT fibers but falls shorter still. The sudden change in voltage in those models after 200 ms is an artifact resulting from $T_R$ dropping below the measurement threshold of 540° C.; if one extrapolates $T_R$ with a simple exponential cooling model, one sees that V is smaller in this period and begins to approach zero. Although the system is not adiabatic, the voltage pulse shape does not agree with predictions for a reaction wave with significant thermal losses.

Figure 20C:
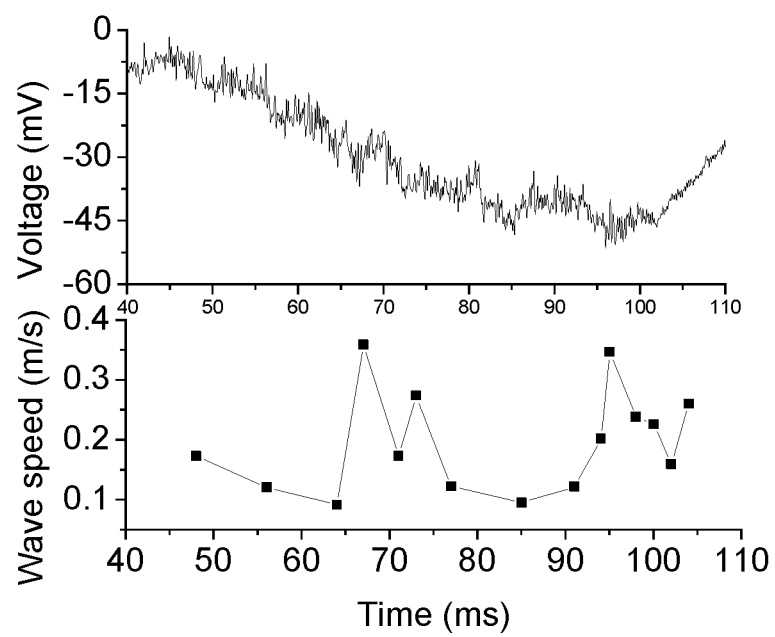
FIG. 20C depicts experimentally observed wave speed and voltage along the carbon nanotubes of a thermopower wave generator as a function of time fur a thermopower wave generator according to the teachings of the present invention.

Previous discussion of the large voltages of thermopower waves focused on the large wave velocities (up to 2 m/s) observed. Effects termed "electron [or hole] entrainment" were posited, phenomenologically describing charge carriers caught up in and accelerated by the rapidly moving reaction front. This description is quite similar to that of phonon drag, known to be a strong contributor to thermoelectricity in carbon nanotubes. However, FIG. 20C shows no strong correlation between |V| and instantaneous wave velocities measured synchronously. While the velocity fluctuates between 0.09 and 0.36 m/s (a factor four difference) the amplitude of voltage oscillations is at most 10 mV. Nevertheless, the average velocity is 0.16 m/s, a factor of 10 smaller than the record for thermopower waves, so it may be that only faster waves exhibit a boost in voltage from wave velocity.

Figure 21A:
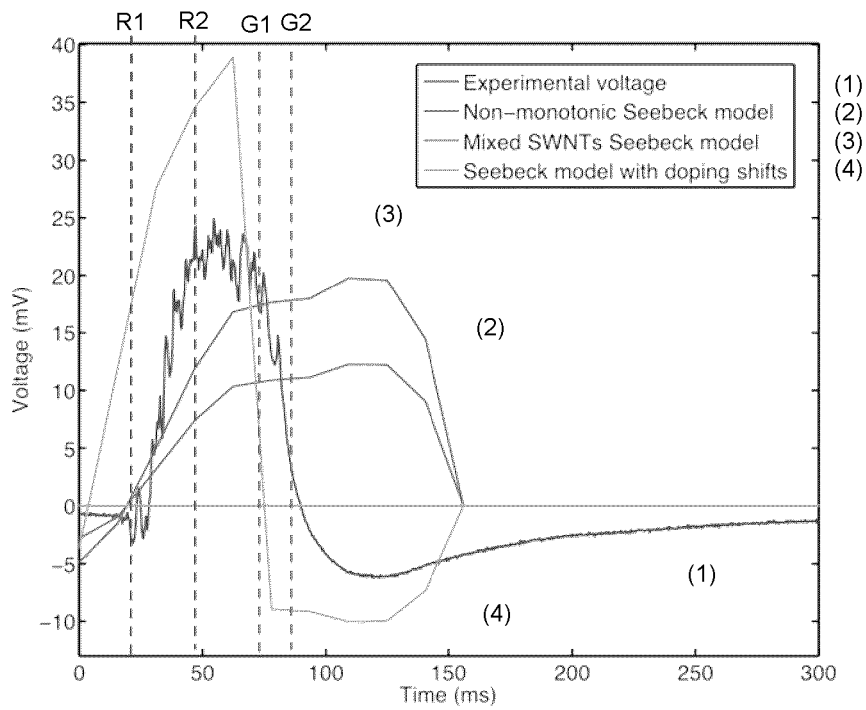
FIGS. 21A-21D depict experimentally observed voltage between the contacts of a thermopower wave generator as a function of time, as well as theoretically calculated voltages of a thermopower wave generator according to the teachings of the present invention.
Figure 21B:
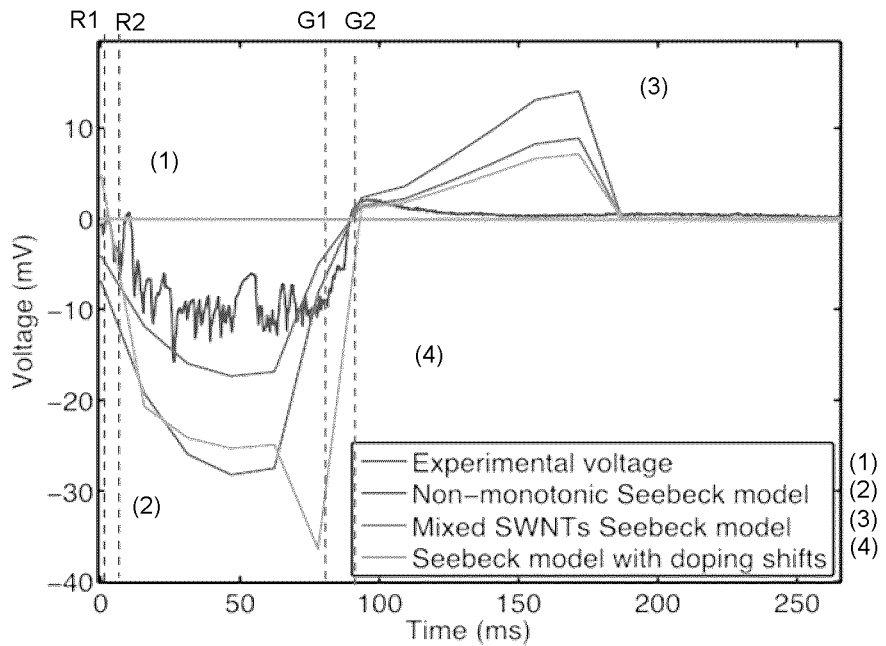
Figure 21C:
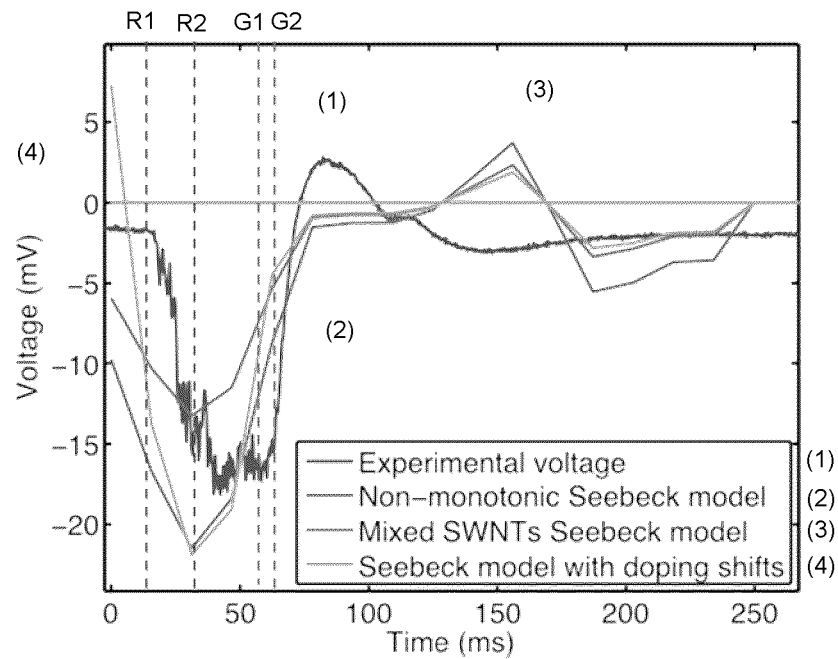
Figure 21D:
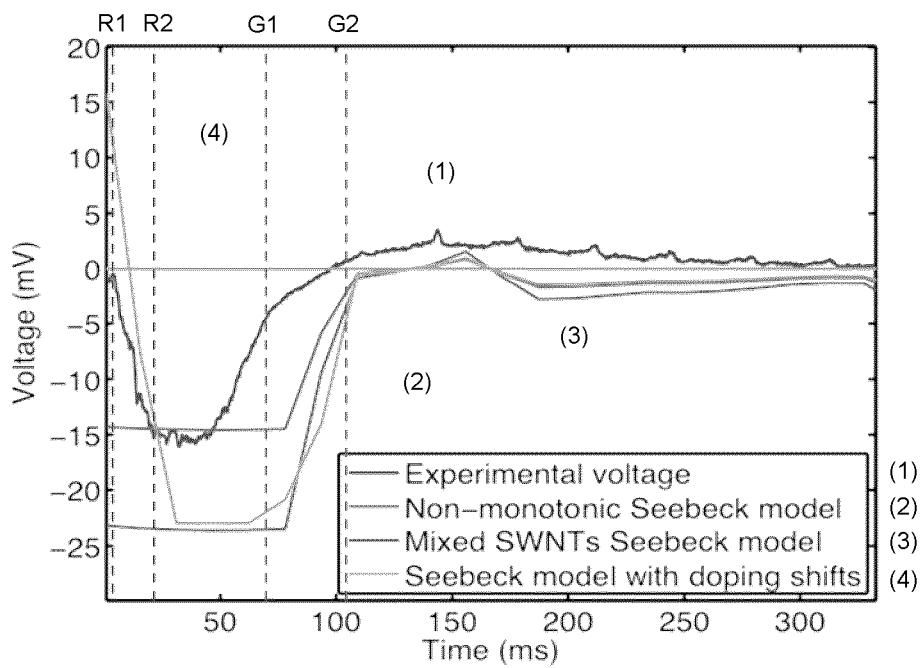

Applying the Seebeck models to temperature measurements from six other thermopower wave generators confirmed that the Seebeck coefficient alone is insufficient to predict voltage pulse shape for most thermopower waves. FIG. 21 shows four selected voltage graphs along with possible models. The models utilized include a non-monotonic function of temperature with a peak around 800 K, a prior art model for mixed-type SWNTs, and a variation on the prior art model where the Seebeck coefficient at each contact changes sign from positive to negative while the fuel is reacting there (predicated on electronic doping by fuel adsorbed on the SWNTs). Interestingly, for these reactions the linear Seebeck model voltage far exceeded the measurements (and thus it is excluded from the graphs for clarity), although all had smaller peak voltage than FIG. 20B. FIG. 21A shows the greatest |V|, 27 mV. Thus, individual SWNT fibers may be different enough in composition that metallic and semiconducting contributions may vary between fibers.

The model for mixed SWNT fibers matches peak voltage magnitudes in FIG. 21 somewhat better, although it can still be off by more than 10 mV. Moreover, it is insufficient to describe bipolar peaks, which all of these reactions exhibit to some extent, either overestimating their magnitude (FIG. 21B) or missing their timing (FIG. 21C). In FIG. 21A, the mixed SWNT model misses the negative voltage entirely. Thus, it seems reasonable that a different $\Gamma=f(T)$ could better describe these reactions, which, after all, occur on SWNT fibers that are made quite differently than SWNT films. While the general form for mixed contributions may be correct, one need not expect that the parameter values should be the same. Conceptually, this new function should be greater than the prior model for T<400° C., which corresponds to the later portions of the graphs where the divergence is greater, and it should be equal to or less than the prior model at reaction temperatures, T>800° C., to bring down the predicted peak voltage.

However, one cannot create such a function by varying the parameters of the mixed SWNT model. The result of iterating a, b, and $T_1$ in Equation (7) is the non-monotonic model in FIG. 21 (a=−0.035, b=2.5, $T_1$=55 K). One might expect that a Seebeck coefficient that peaks as temperature increases (at 930 K) would create significantly different shapes of voltage pulses, but the shapes are quiet similar, with only the magnitude greatly differing. This can be explained by the function's mathematical constraint to pass through the origin, which restricts its variability. It is not possible to create a function in the form of Equation (7) that also meets the conceptual criteria of the previous paragraph.

Since the models diverge most from measured V during the earliest and latest periods of the reaction, the data suggest that an aspect of the chemical reaction of the fuel could account for differences between thermopower waves and Seebeck thermoelectricity. As mentioned earlier, the presence/absence of adsorbed $O_2$ can go so far as to reverse the sign of the Seebeck coefficient by changing the doping of the SWNTs. The desorption time constant has been measured to be about 5 ruin under equilibrating conditions at 350 K. Further, adsorption/desorption has been found to be very strongly thermally activated, so even at 500 K the time constant (extrapolated) drops to a mere 3 ms. Moreover, the extreme, non-equilibrium environment of the exothermic decomposition of picramide and the many intermediate radical species it can produce could conceivably consume $O_2$ through reaction much faster than desorption.

Thus, the third model of FIG. 21 hypothesizes a linear shift of the Seebeck coefficient from positive to negative at each end over the time the reaction is observed (with the camera) to be greatest at that location. These periods are framed on the graphs by red (R1 and R2) and green (G1 and G2) dashed lines for the beginning and end, respectively, of wave propagation. After the red lines (R1 and R2) the ignition-side Γ is negative; after the green lines (G1 and G2), Γ on the opposite side has likewise inverted. In accordance with previously documented measurements, which showed a smaller |Γ| when negative, a ratio of −44/65 is assigned to the negative Seebeck coefficient in this model, while otherwise preserving the form of the temperature dependence. This approach is equivalent to an effective Seebeck coefficient using separate values for hole and electronic properties, weighted by their individual conductivities, a good tack for materials such as SWNTs (and graphene) with ambipolar conduction.

The predictions of this doping-induced Seebeck shift model more closely match the shape of the experimental voltage pulses than the models that do not account for $O_2$ doping. The doping model shows steeper voltage rises compared to the temperature models; for example, in FIG. 21B the first two models have a flat initial voltage from zero time through the peak. The magnitudes of the primary peaks are not necessarily as close to the measurements because it is difficult to quantify the extent of $O_2$ doping (positive and negative) for thermopower wave reactions, which are not as tightly controlled as those of prior experiments. Conceivably, adjusting the ratio of Γ−/Γ+ could better fit the peaks. FIG. 21A benefits the most from the doping model, whereas the other two models miss the second, negative voltage peak. All three models offer about the same predictions for secondary peaks in FIG. 21B-D, but these occur relatively later, after the reaction has finished, hence their difference with FIG. 21A.

The experiments described above represent the first synchronous measurements of temperature, voltage, and velocity of thermopower waves, and they have yielded insights into the physics underlying the power generation of these waves. Simulation of thermopower waves with thermal losses from radiation and conduction to large contacts showed that non-adiabatic waves can produce bipolar voltage pulses. However, modeling of Seebeck voltage from the measured temperature differences does not reproduce the shape of thermopower wave voltage pulses, even accounting for temperature dependence of the Seebeck coefficient. A model including a doping-related shift in the Seebeck coefficient to negative values as oxygen desorbs and reacts at and behind the wave front better fits the measured voltages.

Those having ordinary skill in the art will appreciate that various modifications can be made to the above embodiments without departing from the scope of the invention.

The invention claimed is:

1. A system for generating electrical energy, comprising:
   a nanostructure extending along an axial direction between a proximal end and a distal end, said nanostructure exhibiting a thermal conductivity equal to or greater than about 500 W/m/K and an electrical conductivity equal or greater than about $10^5$ S/m along said axial direction,
   a chemically reactive composition peripherally disposed on at least a portion of said nanostructure along said axial direction so as to be in thermal coupling with said nanostructure, said reactive composition being capable of undergoing a chemical reaction in response to activation to generate heat traveling as a thermal wave along said axial direction,
   wherein the thermal wave is accompanied by a wave of electrical energy propagating along said axial direction.

2. The system of claim 1, further comprising an ignition mechanism adapted to activate said chemically reactive composition so as to generate said thermal wave.

3. The system of claim 2, wherein said ignition mechanism employs light to cause activation of said reactive composition.

4. The system of claim 2, wherein said ignition mechanism employs a high voltage discharge to cause activation of said reactive composition.

5. The system of claim 2, wherein said ignition mechanism employs localized heating to cause activation of said reactive composition.

6. The system of claim 1, wherein said nanostructure comprises a carbon nanotube.

7. The system of claim 6, wherein said carbon nanotube comprises a multi-walled carbon nanotube.

8. The system of claim 1, wherein said nanostructure comprises a nanowire.

9. The system of claim 8, wherein said nanowire is formed of any of silicon, boron nitride, nickel silicide, or lead sulfide.

10. The system of claim 1, wherein said nanostructure comprises a sheet having a nanosized thickness.

11. The system of claim 1, wherein said reactive composition undergoes decomposition in response to activation by said ignition mechanism.

12. The system of claim 1, wherein said reactive composition comprises any of cyclotrimethylene-trinitramine, picramide, picric acid, nitrocellulose, ethanol, isopropanol, and formic acid.

13. The system of claim 1, wherein said reactive composition peripherally coats said nanostructure substantially from said proximal end to said distal end.

14. The system of claim 13, further comprising an ignition mechanism adapted to activate said reactive composition in proximity of said proximal end to generate a reaction front propagating from the proximal end to the distal end, thereby generating and sustaining a thermal wave and an accompanying electric energy wave propagating from said proximal end to said distal end.

15. The system of claim 1, wherein said wave of electrical energy comprises an electrical pulse having a peak power of at least about 20 W/g.

16. The system of claim 1, further comprising a catalyst effective to reduce an activation energy of the chemically reactive composition.

17. The system of claim 16, wherein the catalyst comprises a plurality of metal nanoparticles.

18. A system for generating electrical energy, comprising,
a sheet of a material characterized by two opposed surfaces separated by a thickness of the material forming the sheet, said sheet extending along a longitudinal direction from a proximal end to a distal end,
a chemically reactive composition surrounding at least a portion of at least one of said surfaces so as to be in thermal coupling with said at least one surface, said reactive composition being capable of undergoing a chemical reaction in response to activation to generate heat,
an ignition mechanism adapted to activate said chemically reactive composition so as to generate a thermal wave propagating longitudinally along the sheet,
wherein said thermal wave is accompanied by a wave of electrical energy propagating longitudinally along the sheet.

19. The system of claim 18, wherein said sheet has a thickness less than about 25 nm.

20. The system of claim 18, wherein said sheet exhibits a thermal conductivity equal or greater than about 1000 W/m/K and an electrical conductivity equal or greater than about $10^7$ S/m at least along said longitudinal direction.

21. A method of generating electrical energy, comprising
providing a nanostructure extending along an axial direction and having a coating formed of a chemically reactive compound, said coating being in thermal contact with said nanostructure and said nanostructure exhibiting a thermal conductivity equal or greater than about 500 W/m/K along said axial direction,
initiating a chemical reaction in a portion of said chemically reactive compound at a location along said axial direction so as to generate a heat propagating along said nanostructure to cause a chemical reaction in other portions of said reactive compound, thereby generating and sustaining a heat wave propagating along said axial direction,
wherein said heat wave is accompanied by an electrical pulse propagating along said axial direction.

22. The method of claim 21, wherein said nanostructure comprises a carbon nanotube.

23. The method of claim 21, wherein said nanostructure comprises a sheet having a nanosized thickness.

* * * * *